United States Patent
Kuriki

(10) Patent No.: US 9,370,095 B2
(45) Date of Patent: Jun. 14, 2016

(54) CONDUCTIVE SHEET AND TOUCH PANEL

(71) Applicant: FUJIFILM Corporation, Tokyo (JP)

(72) Inventor: Tadashi Kuriki, Ashigarakami-gun (JP)

(73) Assignee: FUJIFILM CORPORATION, Tokyo (JP)

( * ) Notice: Subject to any disclaimer, the term of this patent is extended or adjusted under 35 U.S.C. 154(b) by 49 days.

(21) Appl. No.: 14/078,063

(22) Filed: Nov. 12, 2013

(65) Prior Publication Data

US 2014/0076612 A1 Mar. 20, 2014

Related U.S. Application Data

(63) Continuation of application No. PCT/JP2012/062127, filed on May 11, 2012.

(30) Foreign Application Priority Data

May 13, 2011 (JP) ................................. 2011-108418

(51) Int. Cl.
*H05K 1/02* (2006.01)
*G06F 3/041* (2006.01)
*G06F 3/044* (2006.01)

(52) U.S. Cl.
CPC .............. *H05K 1/0298* (2013.01); *G06F 3/041* (2013.01); *G06F 3/044* (2013.01); *G06F 2203/04103* (2013.01); *G06F 2203/04112* (2013.01)

(58) Field of Classification Search
CPC ............................... H05K 1/0298; G06F 3/044
USPC .................................... 345/173–174; 174/250
See application file for complete search history.

(56) References Cited

U.S. PATENT DOCUMENTS

| 7,202,859 | B1 | 4/2007 | Speck et al. | |
|---|---|---|---|---|
| 7,864,503 | B2 * | 1/2011 | Chang | G06F 3/044 200/269 |
| 8,052,498 | B2 * | 11/2011 | Chien | G06F 3/0412 430/313 |
| 8,199,127 | B2 * | 6/2012 | Mamba | G06F 3/044 178/18.06 |

(Continued)

FOREIGN PATENT DOCUMENTS

| JP | 5-224818 A | 9/1993 |
|---|---|---|
| JP | 2003-099185 A | 4/2003 |

(Continued)

OTHER PUBLICATIONS

International Search Report issued in PCT/JP2012/062127, mailed on Jul. 31, 2012.

(Continued)

*Primary Examiner* — Christopher E Leiby
(74) *Attorney, Agent, or Firm* — Birch, Stewart, Kolasch & Birch, LLP

(57) ABSTRACT

In this conductive sheet and touch panel, a laminated conductive sheet is configured by laminating: a first conductive sheet having a first conductive pattern configured from a plurality of first sensor units; and a second conductive sheet having a second conductive pattern configured from a plurality of second sensor units. The first sensor units have: a band-shaped section extending in a direction approximately perpendicular to one direction; and a jutting section that juts from both sides of the band-shaped section in the one direction. The second sensor units are formed in a manner so as to approximately fill the regions demarcated by the band-shaped section and the jutting section.

16 Claims, 12 Drawing Sheets

(56) References Cited

U.S. PATENT DOCUMENTS

| | | | | |
|---|---|---|---|---|
| 8,586,874 B2* | 11/2013 | Kuriki | ............... | G06F 3/044 174/250 |
| 8,743,078 B2* | 6/2014 | Kim | ............... | G06F 3/044 345/174 |
| 8,754,868 B2* | 6/2014 | Chang | ............... | G06F 3/0418 345/173 |
| 9,116,586 B2* | 8/2015 | Yilmaz | ............... | G06F 3/044 |
| 2003/0052867 A1 | 3/2003 | Shigetaka et al. | | |
| 2004/0229028 A1 | 11/2004 | Sasaki et al. | | |
| 2004/0239650 A1* | 12/2004 | Mackey | ............... | G06F 3/044 345/174 |
| 2005/0030048 A1* | 2/2005 | Bolender et al. | ............... | 324/661 |
| 2007/0262962 A1* | 11/2007 | XiaoPing | ............... | G06F 1/32 345/173 |
| 2008/0211371 A1 | 9/2008 | Sasaki et al. | | |
| 2009/0002337 A1* | 1/2009 | Chang | ............... | G06F 3/044 345/174 |
| 2009/0315859 A1* | 12/2009 | Chien | ............... | G06F 3/044 345/175 |
| 2010/0045615 A1 | 2/2010 | Gray et al. | | |
| 2010/0060596 A1* | 3/2010 | Whight | ............... | G06F 3/044 345/173 |
| 2010/0073310 A1* | 3/2010 | Liang et al. | ............... | 345/173 |
| 2010/0110038 A1* | 5/2010 | Mo | ............... | G06F 3/044 345/174 |
| 2010/0302201 A1* | 12/2010 | Ritter | ............... | G06F 3/044 345/174 |
| 2010/0302204 A1 | 12/2010 | Miyayama et al. | | |
| 2011/0018838 A1* | 1/2011 | Lee | ............... | G06F 3/044 345/174 |
| 2011/0102370 A1 | 5/2011 | Kono et al. | | |
| 2011/0289771 A1* | 12/2011 | Kuriki | ............... | H05K 3/064 29/829 |
| 2011/0290631 A1* | 12/2011 | Kuriki | ............... | G06F 3/044 200/600 |
| 2011/0304578 A1* | 12/2011 | Kim et al. | ............... | 345/174 |
| 2012/0273336 A1* | 11/2012 | Kuriki | ............... | G06F 3/044 200/600 |
| 2013/0207911 A1* | 8/2013 | Barton | ............... | G06F 3/0488 345/173 |
| 2014/0002378 A1* | 1/2014 | Kim | ............... | G06F 3/044 345/173 |
| 2014/0041216 A1* | 2/2014 | Cok | ............... | G06F 3/044 29/846 |
| 2014/0168109 A1* | 6/2014 | Kang | ............... | G06F 3/044 345/173 |

FOREIGN PATENT DOCUMENTS

| | | |
|---|---|---|
| JP | 2010-39537 A | 2/2010 |
| WO | WO 95/27334 A1 | 10/1995 |
| WO | WO 97/18508 A1 | 5/1997 |
| WO | WO 2005/121940 A2 | 12/2005 |
| WO | WO 2006/001461 A1 | 1/2006 |

OTHER PUBLICATIONS

Written Opinion issued in PCT/JP2012/062127, mailed on Jul. 31, 2012.
Extended European Search Report, dated Feb. 2, 2015, for European Application No. 12786228.2.
Chinese Office Action with a Search Report issued in corresponding Chinese Patent Application No. 201280034046.4 on Oct. 19, 2015.

* cited by examiner

CONDUCTIVE SHEET AND TOUCH PANEL

CROSS-REFERENCE TO RELATED APPLICATIONS AND PRIORITY CLAIM

This application is a Continuation of International Application No. PCT/JP2012/062127 filed on May 11, 2012, which was published under PCT Article 21(2) in Japanese, which is based upon and claims the benefit of priority from Japanese Patent Application No. 2011-108418 filed on May 13, 2011, the contents all of which are incorporated herein by reference.

TECHNICAL FIELD

The present invention relates to a conductive sheet and a touch panel suitable for use in a projected capacitive touch panel.

BACKGROUND ART

Transparent conductive sheets containing thin metal wires have been studied as disclosed in U.S. Patent Application Publication No. 2004/0229028, International Publication No. 2006/001461, etc.

Touch panels have attracted much attention in recent years. The touch panel has currently been used mainly in small devices such as PDAs (personal digital assistants) and mobile phones, and is expected to be used in large devices such as personal computer displays.

A conventional electrode for the touch panel is composed of ITO (indium tin oxide) and therefore has a high resistance. Thus, when the conventional electrode is used in the large device in the above future trend, the large-sized touch panel has a low current transfer rate between the electrodes, and thereby exhibits a low response speed (a long time between finger contact and touch position detection).

A large number of lattices made of thin wires of a metal (thin metal wires) can be arranged to form an electrode with a lowered surface resistance. Touch panels using the electrode of the thin metal wires are known from Japanese Laid-Open Patent Publication No. 05-224818, International Publication No. 1995/27334, U.S. Patent Application Publication No. 2004/0239650, U.S. Pat. No. 7,202,859, International Publication No. 1997/18508, Japanese Laid-Open Patent Publication No. 2003-099185, International Publication No. 2005/121940, etc.

SUMMARY OF INVENTION

The touch panel electrode of the thin metal wires has problems with transparency and visibility because the thin metal wires are composed of an opaque material as described in the above documents such as Japanese Laid-Open Patent Publication No. 05-224818.

In view of the above problems, an object of the present invention is to provide a conductive sheet and a touch panel, which can have an electrode containing a pattern of less-visible, thin metal wires, a high transparency, a high visibility, and improved detection sensitivity.

[1] A conductive sheet according to a first aspect of the present invention comprises a first conductive part and a second conductive part, stacked with a substrate interposed therebetween. The first conductive part contains two or more first conductive patterns arranged in one direction, the first conductive patterns being composed of thin metal wires. The second conductive part contains two or more second conductive patterns arranged in another direction approximately perpendicular to the one direction, the second conductive patterns being composed of thin metal wires. The first conductive patterns each contain two or more first sensing portions connected with each other, the first sensing portions being composed of thin metal wires. The second conductive patterns each contain two or more second sensing portions connected with each other, the second sensing portions being composed of thin metal wires. The first and second sensing portions each contain a plurality of small lattices arranged. The first sensing portions each contain a strip and protrusions, the strip extends in the other direction approximately perpendicular to the one direction, and the protrusions extend from both sides of the strip in the one direction. The second sensing portions each cover most of a region surrounded by the strip and the protrusions. As viewed from above, the overlaps of the first and second conductive patterns each contain a combination of a plurality of the small lattices.

[2] In the first aspect, a width of the strip may be smaller a length of the strip.

[3] In the first aspect, a length of the protrusion may be at least ½ of the width of the strip.

[4] In the first aspect, a width of the protrusion may be at most ½ of the length of the protrusion.

[5] In the first aspect, a length of the second sensing portion in the other direction perpendicular to the one direction may be 0.5 to 2 times as large as a length of the second sensing portion in the one direction.

[6] In the first aspect, the protrusions in two adjacent first sensing portions may be arranged facing each other.

[7] In the first aspect, it is preferred that the small lattices have a side length of 30 to 500 μm, and the thin metal wires have a line width of 15 μm or less.

[8] In the first aspect, it is preferred that the substrate has a thickness of 50 to 350 μm.

[9] A touch panel according to a second aspect of the present invention comprises a conductive sheet, which is used on a display panel. The conductive sheet contains a first conductive part and a second conductive part, stacked with a substrate interposed therebetween. The first conductive part contains two or more first conductive patterns arranged in one direction, the first conductive patterns being composed of thin metal wires. The second conductive part contains two or more second conductive patterns arranged in another direction approximately perpendicular to the one direction, the second conductive patterns being composed of thin metal wires. The first conductive patterns each contain two or more first sensing portions connected with each other, the first sensing portions being composed of thin metal wires. The second conductive patterns each contain two or more second sensing portions connected with each other, the second sensing portions being composed of thin metal wires. The first and second sensing portions each contain a plurality of small lattices arranged. The first sensing portions each contain a strip and protrusions, the strip extends in the other direction approximately perpendicular to the one direction, and the protrusions extend from both sides of the strip in the one direction. The second sensing portions each cover most of a region surrounded by the strip and the protrusions. As viewed from above, the overlaps of the first and second conductive patterns each contain a combination of a plurality of the small lattices.

[10] In the second aspect, a width of the strip may be smaller than a length of the strip.

[11] In the second aspect, a length of the protrusion may be at least ½ of the width of the strip.

[12] In the second aspect, a width of the protrusion may be at most ½ of the length of the protrusion.

[13] In the second aspect, a length of the second sensing portion in the other direction perpendicular to the one direction may be 0.5 to 2 times as large as a length of the second sensing portion in the one direction.

[14] In the second aspect, the protrusions in the adjacent first sensing portions may be arranged facing each other.

[15] In the second aspect, it is preferred that the small lattices have a side length of 30 to 500 μm, and the thin metal wires have a line width of 15 μm or less.

[16] In the second aspect, it is preferred that the substrate has a thickness of 50 to 350 μm.

The conductive sheet and the touch panel of the present invention can have the electrodes containing the patterns of less visible thin metal wires, a high transparency, a high visibility, and an improved detection sensitivity.

DESCRIPTION OF EMBODIMENTS

Figure 1:
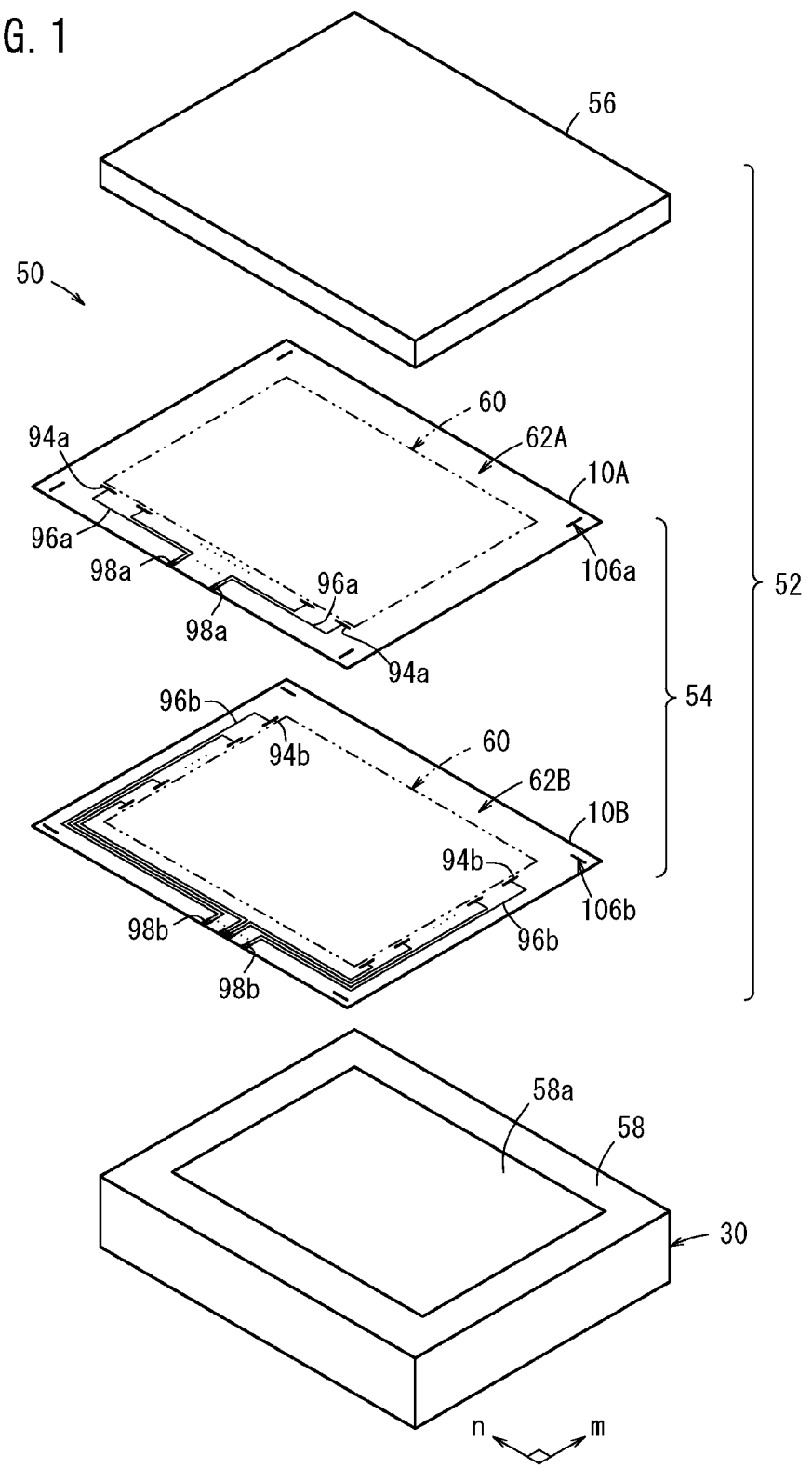
FIG. 1 is an exploded perspective view of a touch panel having a conductive sheet stack containing a conductive sheet according to an embodiment of the present invention.

An embodiment of the conductive sheet and the touch panel having the sheet of the present invention will be described below with reference to FIGS. 1 to 12. It should be noted that, in this description, a numeric range of "A to B" includes both the numeric values A and B as the lower limit and upper limit values.

A touch panel 50 having a conductive sheet according to the embodiment of the present invention will be described below with reference to FIG. 1.

The touch panel 50 has a sensor body 52 and a control circuit such as an integrated circuit (not shown). The sensor body 52 contains a conductive sheet stack according to this embodiment (hereinafter referred to as the conductive sheet stack 54) and thereon a protective layer 56. The conductive sheet stack 54 and the protective layer 56 can be disposed on a display panel 58 of a display device 30 such as a liquid crystal display. As viewed from above, the sensor body 52 has a sensing region 60 corresponding to a display screen 58a of the display panel 58 and a terminal wiring region 62A, 62B (a so-called frame) corresponding to the periphery of the display panel 58.

As shown in FIG. 1, the conductive sheet stack 54 is provided by stacking a first conductive sheet 10A and a second conductive sheet 10B.

Figure 2:
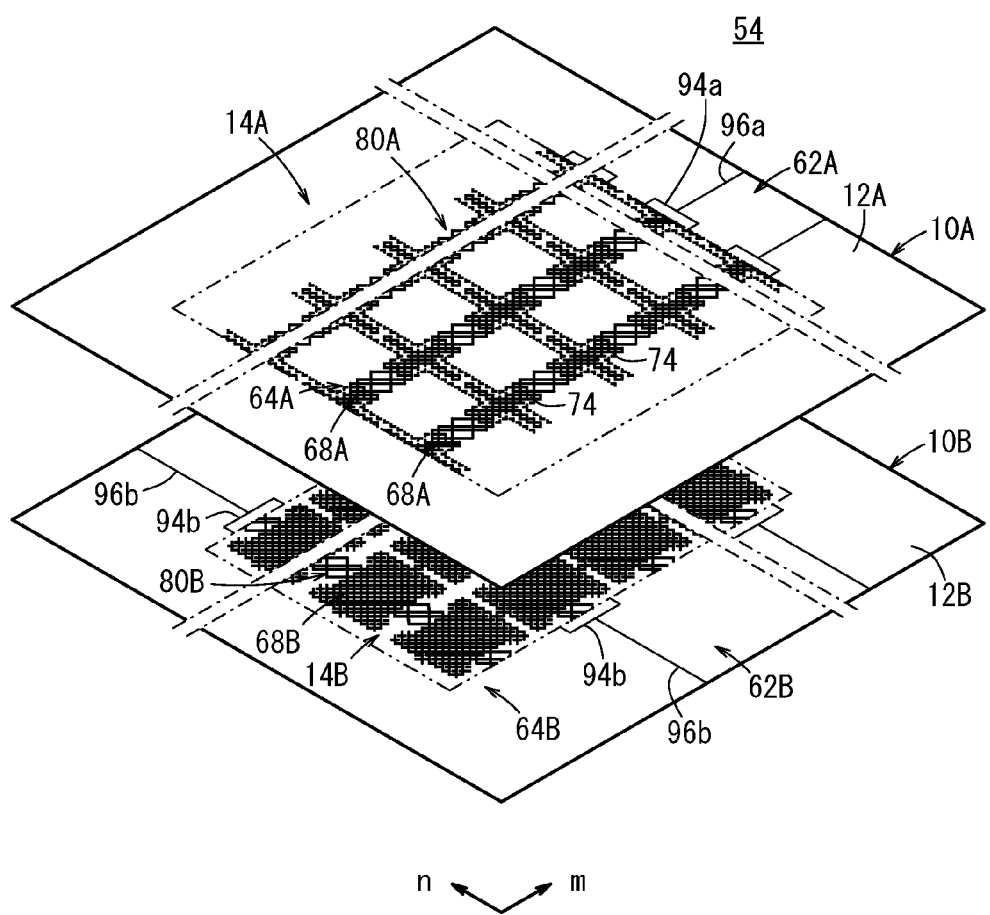
FIG. 2 is a partial exploded perspective view of the conductive sheet stack.
Figure 3A:
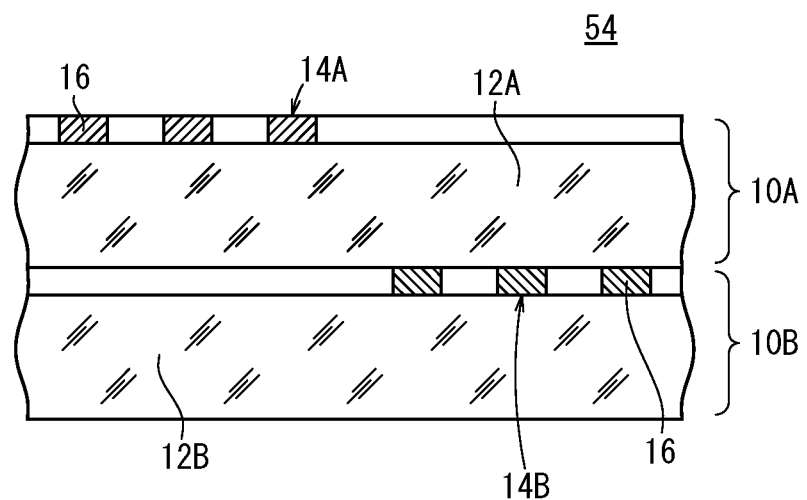
FIG. 3A is a partial cross-sectional view of an example of the conductive sheet stack.
Figure 4:
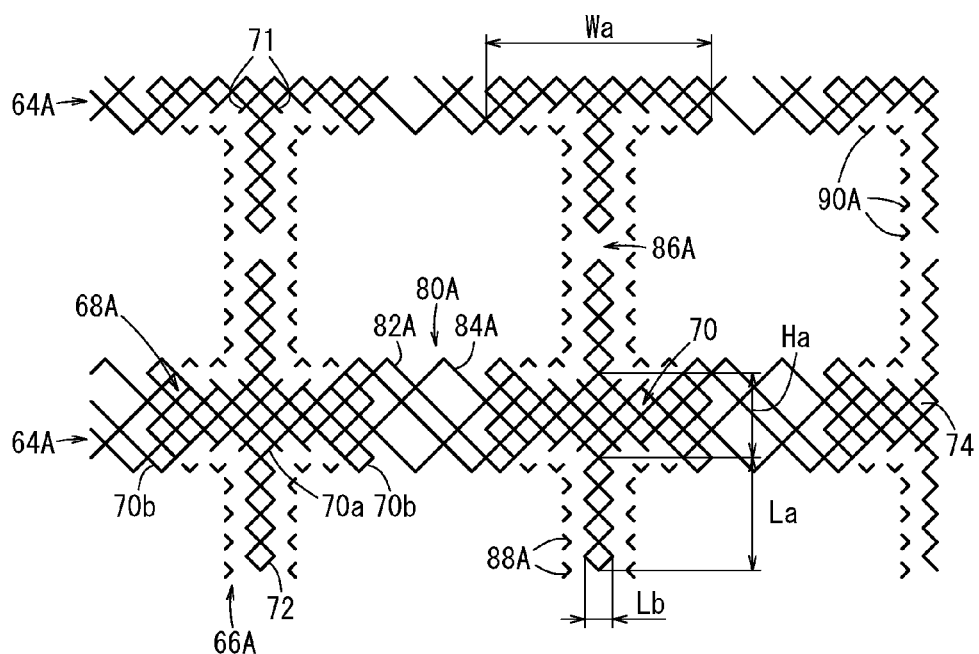
FIG. 4 is a plan view of a pattern example of a first conductive part formed on a first conductive sheet in the conductive sheet stack.

As shown in FIGS. 2, 3A, and 4, the first conductive sheet 10A has a first conductive part 14A formed on one main surface of a first transparent substrate 12A (see FIG. 3A). The first conductive part 14A contains two or more first conductive patterns 64A (mesh patterns) and first auxiliary patterns 66A. The first conductive patterns 64A extend in a horizontal direction (an m direction), are arranged in a vertical direction (an n direction) perpendicular to the horizontal direction, each contain a large number of lattices (sensing portions), and are composed of thin metal wires 16. The first auxiliary patterns 66A are arranged around the first conductive patterns 64A and are composed of the thin metal wires 16. For example, the horizontal direction (the m direction) corresponds to the horizontal or vertical direction of the projected capacitive touch panel 50 or the display panel 58 equipped therewith. In this example, small lattices 74 have a smallest rhombus shape in the drawings. The small lattice 74 may appropriately have an angle of 60° to 120° between a first oblique direction (an x direction) and a second oblique direction (a y direction). The side length of the small lattice 74 is preferably 30 to 500 μm, more preferably 50 to 400 μm, particularly preferably 100 to 350 μm.

The thin metal wire 16 contains, for example, gold (Au), silver (Ag), or copper (Cu). The lower limit of the line width of the thin metal wire 16 may be 0.1 μm or more, and is preferably 1 μm or more, 3 μm or more, 4 μm or more, or 5 μm or more. The upper limit of the line width is preferably 15 μm or less, 10 μm or less, 9 μm or less, or 8 μm or less. When the line width is less than the lower limit, the thin metal wire 16 has an insufficient conductivity, whereby the touch panel 50 using the thin metal wire 16 has insufficient detection sensitivity. On the other hand, when the line width is more than the upper limit, moire is significantly generated due to the thin metal wires 16, and the touch panel 50 using the thin metal wire 16 has a poor visibility. When the line width is within the above range, the moire generated due to the thin metal wire 16 is improved, and the visibility is remarkably improved. It is preferred that at least the first transparent substrate 12A has a thickness of 50 μm or more and to 350 μm or less. The thickness is further preferably 75 μm or more and 250 μm or less, particularly preferably 100 μm or more and 200 μm or less.

The first conductive pattern 64A contains two or more first large lattices (first sensing portions) 68A, which are connected in series in the horizontal direction (the m direction). The first large lattice 68A contains a combination of two or more small lattices 74. The first auxiliary pattern 66A is disposed around a side of the first large lattice 68A, and is not connected to the first large lattice 68A.

The first large lattice 68A contains a strip 70 extending in the horizontal direction, and further contains protrusions 72 extending from the longitudinal center 70a of the strip 70 toward the adjacent first large lattices 68A. The width (the length in the short direction) of the strip 70 is equal to the integral multiple of the length of the vertical diagonal line of the small lattice 74. In the example of FIG. 4, in the strip 70, the ends 70b have the largest width (which is 4 times as large as the length of the vertical diagonal line of the small lattice 74), the center 70a has the second largest width (which is 3 times as large as the length), and a portion between the end 70b and the center 70a has the smallest width (which is equal to the length). Thus, the width of the strip 70 may vary within a certain range. The maximum/minimum ratio between the maximum and minimum values of the width may be 1 or more and 5 or less, preferably 1 or more and 4 or less.

The length of the strip 70 (the length Wa between the ends 70b) is larger than the width of the strip 70 (the width Ha of the center 70a). The length Wa is preferably at least 1.2 times, more preferably at least 1.5 times, further preferably at least 2 times, larger than the width Ha. In this case, the strip 70 can have an excellent conductivity to transmit a signal charge stored in the protrusion 72 at high speed, so that the detection sensitivity can be improved.

In the strip 70, projecting sides 71, which each correspond to one side of the small lattice 74, extend in the first or second oblique direction between the end 70b and the center 70a.

The protrusion 72 extends in the vertical direction, and the length La of the protrusion 72 is at least ½ of the width Ha of the center 70a in the strip 70. The length La is preferably ½ or more and 10 or less times, more preferably 1 or more and 5 or less times, as large as the width Ha. The width Lb of the protrusion 72 in the horizontal direction is at most ½ of the length La of the protrusion 72. The width Lb is preferably ¹⁄₁₀ or more and ½ or less, more preferably ¹⁄₁₀ or more and ⅓ or less, of the length La. In this case, the protrusion 72 can act as an electrode to store a signal charge corresponding to a touch position of a finger (or an input pen). The shape of the protrusion 72 is not limited to the example of FIG. 5. A plurality of protrusions may further extend from the protrusion 72, and the end of the protrusion 72 may be branched to form a bifurcated geometric shape. The shapes of second large lattices (second sensing portions) 68B to be hereinafter described may be selected depending on the shape of the protrusion 72.

As shown in FIG. 4, first connections 80A composed of the thin metal wires 16 are formed between the first large lattices 68A, and each adjacent two of the first large lattices 68A arranged in the horizontal direction are connected by the first connection 80A. The first connection 80A contains first medium lattices 82A, 84A. The size of the first medium lattice 82A corresponds to the total size of n small lattices 74 (in which n is an integer larger than 1) arranged in the first oblique direction. The size of the first medium lattice 84A corresponds to the total size of p×q small lattices 74 (in which p and q are each an integer larger than 1). Thus, the first medium lattice 84A is provided such that p small lattices 74 are arranged in the first oblique direction and q small lattices 74 are arranged in the second oblique direction. In the example of FIG. 4, n is 7, and the size of the first medium lattice 82A corresponds to the total size of seven small lattices 74 arranged in the first oblique direction. Furthermore, p is 3 in the first oblique direction, q is 5 in the second oblique direction, and the size of the first medium lattice 84A corresponds to the total size of fifteen small lattices 74.

In addition, first disconnection portions 86A are disposed between the adjacent first conductive patterns 64A arranged in the vertical direction. The first large lattices 68A in the adjacent first conductive patterns 64A are isolated from each other by the first disconnection portions 86A. The first disconnection portions 86A are located between the ends of the protrusions 72 of the adjacent first conductive patterns 64A. Thus, the protrusions 72 in the adjacent first conductive patterns 64A are arranged facing each other, and the first disconnection portions 86A are sandwiched by the protrusions 72 of the adjacent first conductive patterns 64A.

In the first conductive part 14A, the first auxiliary patterns 66A are arranged around the first large lattices 68A, and are isolated from the first large lattices 68A. The first auxiliary pattern 66A contains first L-shaped patterns 90A. Each first L-shaped pattern 90A is provided by combining two or more first auxiliary wires 88A (having an axis direction parallel to the first or second oblique direction) into an L-shape.

The length of the first auxiliary wire 88A is smaller than the side length of the small lattice 74. In the example of FIG. 4, the length of the first auxiliary wire 88A is approximately half of the side length of the small lattice 74.

As shown in FIG. 4, the first L-shaped patterns 90A are formed along the strip 70 or the protrusion 72. The first L-shaped patterns 90A formed along the strip 70 are arranged in the horizontal direction, and the first L-shaped patterns 90A formed along the protrusion 72 are arranged in the vertical direction. In the vicinity of the ends of the protrusions 72, the first L-shaped patterns 90A are arranged facing each other in the horizontal direction, and the first disconnection portion 86A is sandwiched by the first L-shaped patterns 90A.

Thus, the first conductive part 14A has the first conductive patterns 64A and the first auxiliary patterns 66A. The first conductive patterns 64A each contain the first large lattices 68A connected by the first connections 80A in the horizontal direction, and are arranged in the vertical direction. The first auxiliary patterns 66A are arranged along the first large lattices 68A in the first conductive patterns 64A. The patterns are regularly arranged, and thus first unit patterns 92A are repeatedly arranged in the first conductive part 14A. Then, the first unit pattern 92A will be specifically described below with reference to FIG. 5. The first unit pattern 92A contains one first large lattice 68A, the first connection 80A connected to one end 70b of the strip 70 in this first large lattice 68A, and the first auxiliary pattern 66A arranged around this first large lattice 68A. In the horizontal direction, the other end 70b of the strip 70 in this first large lattice 68A is at a distance Lva from one end of the first connection 80A (the end connected with the adjacent first large lattice 68A). In the vertical direction, the end of one protrusion 72 in this first large lattice 68A is at a distance Lha from the end of one protrusion 72 in the adjacent first large lattice 68A (the end facing the other protrusion 72 in this first large lattice 68A). The size of the first unit pattern 92A can be represented using the distances Lva and Lha.

In this case, the size, i.e. the aspect ratio (Lva/Lha), of the first unit pattern 92A satisfies the condition of 0.57<Lva/Lha<1.74.

In a case where the horizontal direction (the m direction) is equal to the pixel arrangement direction of the display device 30 having the touch panel 50 (see FIG. 1), the aspect ratio (Lva/Lha) of the first unit pattern 92A satisfies the condition of 0.57<Lva/Lha<1.00 or 1.00<Lva/Lha<1.74, and more preferably satisfies the condition of 0.62<Lva/Lha<0.81 or 1.23<Lva/Lha<1.61.

The lower limit of each of the horizontal distance Lva and the vertical distance Lha in the first unit pattern 92A is preferably 2 mm or more, 3 mm or more, or 4 mm or more, and the upper limit thereof is preferably 16 mm or less, 12 mm or less, or 8 mm or less. When the distance Lva or Lha is less than the lower limit, the first large lattice 68A in the unit pattern exhibits a lowered electrostatic capacitance in a touch panel in the detection process, and the touch panel is likely to cause a detection trouble. On the other hand, when the distance Lva or Lha is more than the upper limit, the position detection accuracy may be deteriorated.

For the same reasons, the side length of the small lattice 74 in the first large lattice 68A is preferably 30 to 500 μm, more preferably 50 to 400 μm, particularly preferably 100 to 350 μm, most preferably 150 to 300 μm, as described above. As long as the side length of the small lattice 74 falls within this range, the first conductive sheet 10A has a high transparency and thereby can be suitably used at the front of the display device 30 with excellent visibility.

As shown in FIG. 2, in the first conductive sheet 10A having the above structure, in one end of each first conductive pattern 64A, the first connection 80A is not disposed on the open end of the first large lattice 68A. In the other end of the first conductive pattern 64A, the end of the first large lattice 68A is connected to a first terminal wiring pattern 96a composed of the thin metal wire 16 by a first wire connection 94a.

Thus, as shown in FIGS. 1 and 2, in the first conductive sheet 10A used in the touch panel 50, a large number of the above first conductive patterns 64A are arranged in the sensing region 60, and a plurality of the first terminal wiring patterns 96a extend from the first wire connections 94a in the terminal wiring region 62A.

In the example of FIG. 1, the first conductive sheet 10A and the sensing region 60 each have a rectangular shape as viewed from above. In the terminal wiring region 62A, a plurality of first terminals 98a are arranged in the longitudinal center in the length direction of the periphery on one long side of the first conductive sheet 10A. The first wire connections 94a are arranged in a straight line in the n direction along one long side of the sensing region 60 (a long side closest to the one long side of the first conductive sheet 10A). The first terminal wiring pattern 96a extends from each first wire connection 94a to the center of the one long side of the first conductive sheet 10A, and is connected to the corresponding first terminal 98a.

The first conductive pattern 64A is not limited to the example using the first large lattices 68A. For example, the first conductive pattern 64A may be provided such that a large number of the small lattices 74 are arranged to form a strip-shaped mesh pattern, and a plurality of the mesh patterns are arranged in parallel and are isolated from each other by insulations. For example, two or more of strip-shaped first conductive patterns 64A may each extend from a terminal in the m direction and may be arranged in the n direction. Alternatively, a plurality of strip-shaped mesh patterns may extend from each terminal. Furthermore, the first auxiliary pattern 66A may be parallel to the first conductive pattern 64A, and may be a mesh pattern of a part of the small lattice 74. In this case, the first auxiliary pattern 66A may be connected with or separated from the first conductive pattern 64A.

Figure 6:
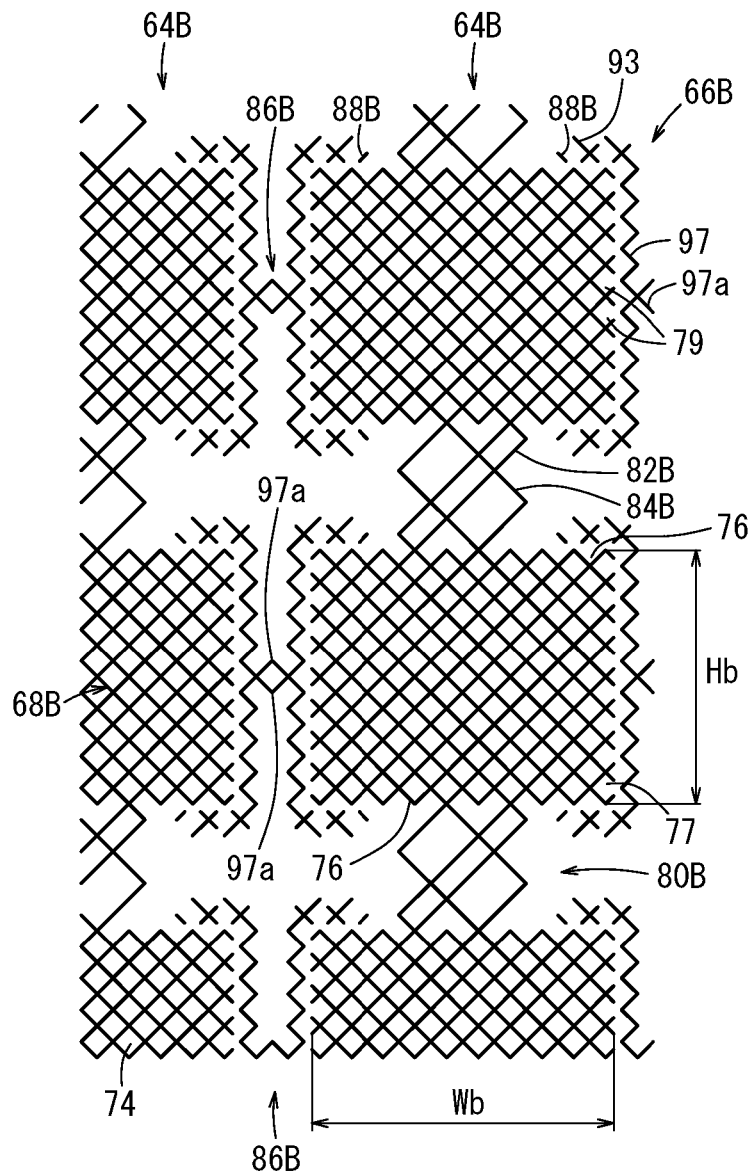
FIG. 6 is a plan view of a pattern example of a second conductive part formed on a second conductive sheet in the conductive sheet stack.

As shown in FIGS. 2, 3A, and 6, the second conductive sheet 10B has a second conductive part 14B formed on one main surface of a second transparent substrate 12B (see FIG. 3A). The second conductive part 14B contains two or more second conductive patterns 64B and second auxiliary patterns 66B. The second conductive patterns 64B extend in the vertical direction (the n direction), are arranged in the horizontal direction (the m direction), each contain a large number of lattices (sensing portions), and are composed of the thin metal wires 16. The second auxiliary patterns 66B are arranged around the second conductive patterns 64B and are composed of the thin metal wires 16.

The second conductive pattern 64B contains two or more second large lattices (second sensing portions) 68B, which are connected in series in the vertical direction (the n direction). The second large lattice 68B contains a combination of two or more small lattices 74. The second auxiliary pattern 66B is disposed around a side of the second large lattice 68B, and is not connected to the second large lattice 68B.

The second large lattice 68B has an approximately rectangular shape containing two horizontal sides 76 and two vertical sides 77. The length Wb of the horizontal side 76 (the width Wb of the second large lattice 68B) is 0.5 or more and 2 or less times, more preferably 0.6 or more and 1.8 or less times, further preferably 0.7 or more and 1.5 or less times, as large as the length Hb of the vertical side 77 (the height Hb of the second large lattice 68B). In the example of FIG. 6, the vertical side 77 has a cut portion 79 provided by removing a part of the small lattice 74.

As shown in FIG. 6, second connections 80B composed of the thin metal wires 16 are formed between the second large lattices 68B, and each adjacent two of the second large lattices 68B arranged in the vertical direction are connected by the second connection 80B. The second connection 80B contains second medium lattices 82B, 84B. The size of the second medium lattice 82B corresponds to the total size of n small lattices 74 (in which n is an integer larger than 1) arranged in the second oblique direction (the y direction). The size of the second medium lattice 84B corresponds to the total size of p×q small lattices 74 (in which p and q are each an integer larger than 1). Thus, the second medium lattice 84B is such that p small lattices 74 are arranged in the first oblique direction and q small lattices 74 are arranged in the second oblique direction. In the example of FIG. 6, n is 7, and the size of the second medium lattice 82B corresponds to the total size of seven small lattices 74 arranged in the second oblique direction. Furthermore, p is 5 in the first oblique direction, q is 3 in the second oblique direction, and the size of the second medium lattice 84B corresponds to the total size of fifteen small lattices 74.

In addition, second disconnection portions 86B are disposed between the adjacent second conductive patterns 64B arranged in the horizontal direction. The second large lattices 68B in the adjacent second conductive patterns 64B are isolated from each other by the second disconnection portions 86B.

In the second conductive part 14B, the second auxiliary patterns 66B are arranged around the second large lattices 68B, and are isolated from the second large lattices 68B. The second auxiliary pattern 66B contains a second auxiliary wire 88B having an axis direction parallel to the first or second oblique direction, and further contains a chain pattern 97 arranged along the vertical side 77 in the second disconnection portion 86B.

The length of the second auxiliary wire 88B is smaller than the side length of the small lattice 74. In the example of FIG. 6, the length of the second auxiliary wire 88B is approximately half of the side length of the small lattice 74.

A cross-shaped pattern 93 is located in the vicinity of each of four corners of the approximately rectangular second large lattice 68B. The chain pattern 97 extends along the vertical side 77 of the second large lattice 68B, and a cross-shaped portion 97a is formed in the center thereof. The cross-shaped portion 97a on one chain pattern 97 is connected with the cross-shaped portion 97a on another chain pattern 97 arranged facing the cut portion 79 in the adjacent second large lattice 68B, to form one or more small lattices 74. In the example of FIG. 6, one small lattice 74 is formed by two cross-shaped portions 97a.

Thus, the second conductive part 14B has the second conductive patterns 64B and the second auxiliary patterns 66B.

The second conductive patterns 64B each contain the second large lattices 68B connected by the second connections 80B in the vertical direction, and are arranged in the horizontal direction. The second auxiliary patterns 66B are arranged along the approximately rectangular shapes of the second large lattices 68B in the second conductive patterns 64B. The patterns are regularly arranged, and thus second unit patterns 92B are repeatedly arranged in the second conductive part 14B. Then, the second unit pattern 92B will be specifically described below with reference to FIG. 7. The second unit pattern 92B contains one second large lattice 68B, the second connection 80B connected to one horizontal side 76 of this second large lattice 68B, and the second auxiliary pattern 66B arranged around this second large lattice 68B. In the vertical direction, the other horizontal side 76 of this second large lattice 68B is at a distance Lvb from one end of the second connection 80B (the end connected with the adjacent second large lattice 68B). The end of the cross-shaped portion 97a facing one vertical side 77 is at a distance Lhb from the end of the cross-shaped portion 97a facing the other vertical side 77. The size of the second unit pattern 92B can be represented using the distances Lvb and Lhb.

In this case, the size, i.e. the aspect ratio (Lvb/Lhb), of the second unit pattern 92B satisfies the condition of 0.57<Lvb/Lhb<1.74.

In a case where the vertical direction (the n direction) is equal to the pixel arrangement direction of the display device 30 having the touch panel 50 (see FIG. 1), the aspect ratio (Lvb/Lhb) of the second unit pattern 92B satisfies the condition of 0.57<Lvb/Lhb<1.00 or 1.00<Lvb/Lhb<1.74, and more preferably satisfies the condition of 0.62<Lvb/Lhb<0.81 or 1.23<Lvb/Lhb<1.61.

The lower limit of each of the vertical distance Lvb and the horizontal distance Lhb in the second unit pattern 92B is preferably 2 mm or more, 3 mm or more, or 4 mm or more, and the upper limit thereof is preferably 16 mm or less, 12 mm or less, or 8 mm or less. When the distance Lvb or Lhb is less than the lower limit, the second large lattice 68B in the unit pattern exhibits a lowered electrostatic capacitance in the touch panel 50 in the detection process, and the touch panel 50 is likely to cause a detection trouble. On the other hand, when the distance Lvb or Lhb is more than the upper limit, the position detection accuracy may be deteriorated.

For the same reasons, the side length of the small lattice 74 in the second large lattice 68B is preferably 50 μm or more, more preferably 100 to 400 μm, further preferably 150 to 300 μm, most preferably 210 to 250 μm, as described above. As long as the side length of the small lattice 74 falls within this range, the second conductive sheet 10B has a high transparency and thereby can be suitably used at the front of the display device 30 with excellent visibility.

For example, as shown in FIGS. 1 and 2, in the second conductive sheet 10B having the above structure, in one end of each alternate (odd-numbered) second conductive pattern 64B and in the other end of each even-numbered second conductive pattern 64B, the second connection 80B is not formed on the open end of the second large lattice 68B. In the other end of each odd-numbered second conductive pattern 64B and in one end of each even-numbered second conductive pattern 64B, the end of the second large lattice 68B is connected to a second terminal wiring pattern 96b composed of the thin metal wire 16 by a second wire connection 94b.

Thus, as shown in FIG. 2, in the second conductive sheet 10B used in the touch panel 50, a large number of the second conductive patterns 64B are arranged in the sensing region 60, and a plurality of the second terminal wiring patterns 96b extend from the second wire connections 94b in the terminal wiring region 62B.

As shown in FIG. 1, in the terminal wiring region 62B, a plurality of second terminals 98b are arranged in the longitudinal center in the length direction of the periphery on one long side of the second conductive sheet 10B. For example, the odd-numbered second wire connections 94b are arranged in a straight line in the m direction along one short side of the sensing region 60 (a short side closest to one short side of the second conductive sheet 10B), and the even-numbered second wire connections 94b are arranged in a straight line in the m direction along the other short side of the sensing region 60 (a short side closest to the other short side of the second conductive sheet 10B).

For example, each odd-numbered second conductive pattern 64B is connected to the corresponding odd-numbered second wire connection 94b, and each even-numbered second conductive pattern 64B is connected to the corresponding even-numbered second wire connection 94b. The second terminal wiring patterns 96b extend from the odd-numbered and even-numbered second wire connections 94b to the center of one long side of the second conductive sheet 10B, and are each connected to the corresponding second terminal 98b.

The second conductive pattern 64B is not limited to the example using the second large lattices 68B. For example, the second conductive pattern 64B may be provided such that a large number of the small lattices 74 are arranged to form a strip-shaped mesh pattern, and a plurality of the mesh patterns are arranged in parallel and are isolated from each other by insulations. For example, two or more of strip-shaped second conductive patterns 64B may each extend from a terminal in the n direction and may be arranged in the m direction. Alternatively, a plurality of strip-shaped mesh patterns may extend from each terminal. Furthermore, the second auxiliary pattern 66B may be parallel to the second conductive pattern 64B, and may be a mesh pattern of a part of the small lattice 74. In this case, the second auxiliary pattern 66B may be connected with or separated from the second conductive pattern 64B.

The first terminal wiring patterns 96a may be arranged in the same manner as the above second terminal wiring patterns 96b, and the second terminal wiring patterns 96b may be arranged in the same manner as the above first terminal wiring patterns 96a. The line widths of the first terminal wiring patterns 96a and the second terminal wiring patterns 96b may be equal to or different from those of the first conductive patterns 64A and the second conductive patterns 64B. It is preferred that the first conductive patterns 64A, the second conductive patterns 64B, the first auxiliary patterns 66A, and the second auxiliary patterns 66B have the same line width.

Figure 8:
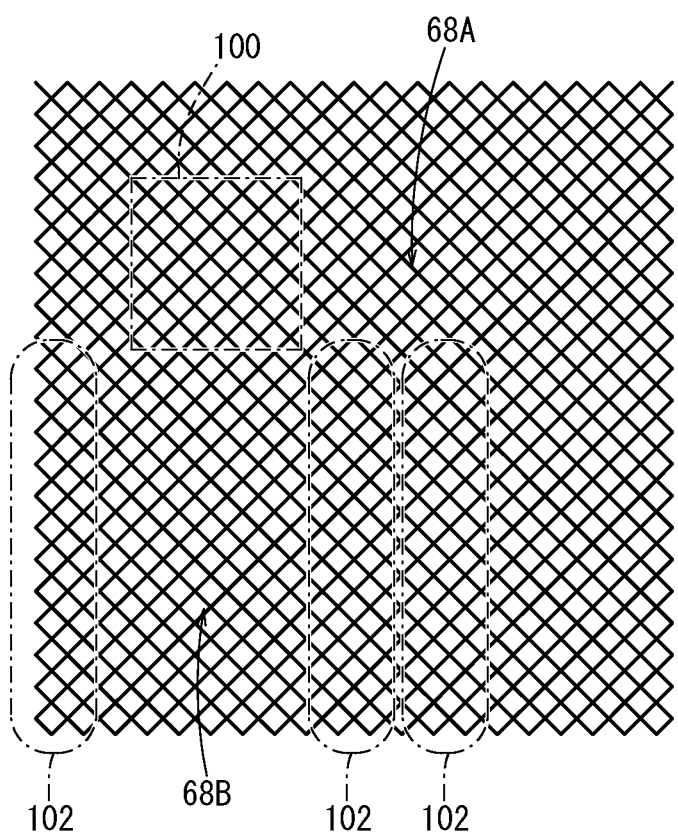
FIG. 8 is a partial plan view of the conductive sheet stack formed by combining the first and second conductive sheets.

For example, as shown in FIG. 8, when the first conductive sheet 10A is stacked on the second conductive sheet 10B to form the conductive sheet stack 54, the first conductive patterns 64A and the second conductive patterns 64B are crossed. Specifically, the first connections 80A of the first conductive patterns 64A and the second connections 80B of the second conductive patterns 64B are arranged facing each other with the first transparent substrate 12A (see FIG. 3A) interposed therebetween, and also the first disconnection portions 86A of the first conductive part 14A and the second disconnection portions 86B of the second conductive part 14B are arranged facing each other with the first transparent substrate 12A interposed therebetween.

As shown in FIG. 8, when the conductive sheet stack 54 is observed from above, the spaces between the first large lattices 68A of the first conductive sheet 10A are filled with the second large lattices 68B of the second conductive sheet 10B.

In this case, the first connections 80A and the second connections 80B overlap with each other. Thus, the first medium lattices 82A and the second medium lattices 82B overlap with each other, and the first medium lattices 84A and the second medium lattices 84B overlap with each other, to form approximately rectangular combined patterns 100. In the combined pattern 100, the first medium lattice 82A and the second medium lattice 82B are located on the diagonal lines. The combined pattern 100, which is formed by the first connection 80A and the second connection 80B shown in FIGS. 5 and 7, contains twenty-five small lattices 74 in total. Thus, in the combined pattern 100, seven small lattices 74 are arranged on each diagonal line, and four small lattices 74 are arranged on each of four sides.

Figure 9:
FIG. 9 is an explanatory view of one line formed by first and second auxiliary wires.

Furthermore, between the first large lattices 68A and the second large lattices 68B, the first auxiliary patterns 66A and the second auxiliary patterns 66B overlap with each other to form combined patterns 102. As shown in FIG. 9, in the combined pattern 102, a first axis 104A of the first auxiliary wire 88A corresponds to a second axis 104B of the second auxiliary wire 88B, the first auxiliary wire 88A does not overlap with the second auxiliary wire 88B, and an end of the first auxiliary wire 88A corresponds to an end of the second auxiliary wire 88B, whereby one side of the small lattice 74 (mesh shape) is formed. For example, in the combined pattern 102, which is formed by the first auxiliary pattern 66A and the second auxiliary pattern 66B shown in FIGS. 5 and 7, an end of the first L-shaped pattern 90A along the strip 70 corresponds to an end of the cross-shaped pattern 93 in the second auxiliary pattern 66B. Furthermore, the cut portion 79 on the vertical side 77 of the second large lattice 68B is compensated by the first L-shaped pattern 90A, arranged along the protrusion 72, in the first auxiliary pattern 66A.

Therefore, the combined patterns 100 and 102 each contain a combination of two or more small lattices 74 (mesh shapes). Consequently, as shown in FIG. 8, when the conductive sheet stack 54 is observed from above, the entire surface is covered with a large number of the small lattices 74 (mesh shapes).

When the conductive sheet stack 54 is used in the touch panel 50, the protective layer 56 is formed on the first conductive sheet 10A, and the first terminal wiring patterns 96a extending from the first conductive patterns 64A in the first conductive sheet 10A and the second terminal wiring patterns 96b extending from the second conductive patterns 64B in the second conductive sheet 10B are connected to a scan control circuit or the like.

A self or mutual capacitance technology can be preferably used for detecting the touch position. In the self capacitance technology, a voltage signal for the touch position detection is sequentially supplied to the first conductive patterns 64A, and further a voltage signal for the touch position detection is sequentially supplied to the second conductive patterns 64B. When a finger comes into contact with or close to the upper surface of the protective layer 56, the capacitance between the first conductive pattern 64A and the second conductive pattern 64B in the touch position and the GND (ground) is increased, whereby signals from this first conductive pattern 64A and this second conductive pattern 64B have waveforms different from those of signals from the other conductive patterns. Thus, the touch position is calculated by a control circuit based on the signals transmitted from the first conductive pattern 64A and the second conductive pattern 64B. On the other hand, in the mutual capacitance technology, for example, a voltage signal for the touch position detection is sequentially supplied to the first conductive patterns 64A, and the second conductive patterns 64B are sequentially subjected to sensing (transmitted signal detection). When a finger comes into contact with or close to the upper surface of the protective layer 56, the parallel stray capacitance of the finger is added to the parasitic capacitance between the first conductive pattern 64A and the second conductive pattern 64B in the touch position, whereby a signal from this second conductive pattern 64B has a waveform different from those of signals from the other second conductive patterns 64B. Thus, the touch position is calculated by a control circuit based on the order of the first conductive pattern 64A supplied with the voltage signal and the signal transmitted from the second conductive pattern 64B. Even when two fingers come into contact with or close to the upper surface of the protective layer 56 simultaneously, the touch positions can be detected by using the self or mutual capacitance technology. Conventional related detection circuits used in the projected capacitive technologies are described in U.S. Pat. Nos. 4,582,955, 4,686,332, 4,733,222, 5,374,787, 5,543,588, and 7,030,860, U.S. Patent Publication No. 2004/0155871, etc.

Figure 3B:
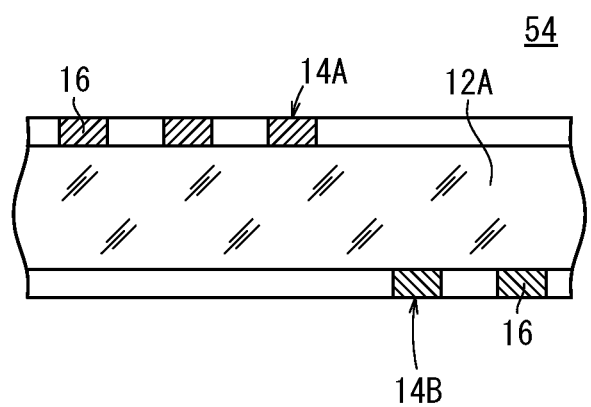
FIG. 3B is a partial cross-sectional view of another example of the conductive sheet stack.

In the above conductive sheet stack 54, as shown in FIGS. 2 and 3A, the first conductive part 14A is formed on the one main surface of the first transparent substrate 12A, the second conductive part 14B is formed on the one main surface of the second transparent substrate 12B. Alternatively, as shown in FIG. 3B, the first conductive part 14A may be formed on the one main surface of the first transparent substrate 12A, and the second conductive part 14B may be formed on the other main surface of the first transparent substrate 12A. In this case, the second transparent substrate 12B is not used, the first transparent substrate 12A is stacked on the second conductive part 14B, and the first conductive part 14A is stacked on the first transparent substrate 12A. In addition, another layer may be disposed between the first conductive sheet 10A and the second conductive sheet 10B. The first conductive patterns 64A and the second conductive patterns 64B may be arranged facing each other as long as they are insulated.

The strip 70 and the protrusions 72 in the first large lattice 68A have relatively thin shapes, and the second large lattice 68B has a relatively wide, approximately rectangular shape. Therefore, the occupation area of the second large lattices 68B is larger than that the occupation area of the first large lattices 68A. Thus, the occupation area of the second conductive patterns 64B closer to the display device 30 is larger than that of the first conductive patterns 64A.

In general, the second conductive patterns 64B, which are located closer to the display device 30, can act to reduce noise impact of an electromagnetic wave. Thus, a skin current flows in a particular direction to block an electric-field component of the electromagnetic wave, and an eddy current flows in a particular direction to block a magnetic-field component of the electromagnetic wave, whereby the noise impact of the electromagnetic wave can be reduced. In the conductive sheet stack 54, since the occupation area of the second conductive patterns 64B closer to the display device 30 is larger than that of the first conductive patterns 64A, the second conductive patterns 64B can have a low surface resistance of 70 ohm/sq or less. Consequently, the conductive sheet stack 54 is advantageous in the reduction of the noise impact of the electromagnetic wave from the display device 30 or the like.

As described above, the occupation area of the second large lattices 68B is larger than that of the first large lattices 68A. Therefore, in the case of using the self capacitance technology for the finger touch position detection, though the second conductive patterns 64B are positioned at a longer distance from the touch position, the second conductive patterns 64B having a relatively larger area can store a large amount of signal charge in the same manner as the first conductive patterns 64A, and the second conductive patterns 64B can exhibit a detection sensitivity approximately equal to that of the first conductive patterns 64A. Thus, the burden of signal processing can be reduced, and the detection accuracy can be improved. In the case of using the mutual capacitance technology for the finger touch position detection, the second conductive patterns 64B having the larger occupation area can be used as drive electrodes, the first conductive patterns 64A can be used as receiving electrodes, and the first conductive patterns 64A can exhibit a high receiving sensitivity. Furthermore, even in a case where the first conductive patterns 64A partially overlap with the second conductive patterns 64B to form a parasitic capacitance, since the first transparent substrate 12A has a thickness of 50 μm or more and 350 μm or less, the increase of the parasitic capacitance can be prevented, and the reduction of the detection sensitivity can be prevented.

Consequently, even in the case of using the patterns of the thin metal wires 16 in the electrodes, the thin metal wires 16 are less visible, and the first conductive sheet 10A, the second conductive sheet 10B, and the conductive sheet stack 54 can have a high transparency, an improved S/N ratio of detection signal, an improved detection sensitivity, and an improved detection accuracy.

When the first conductive patterns 64A have an occupation area A1 and the second conductive patterns 64B have an occupation area A2, the occupation areas preferably satisfy the condition of $1<A2/A1\leq 20$, more preferably satisfy the condition of $1<A2/A1\leq 10$, and particularly preferably satisfy the condition of $2\leq A2/A1\leq 10$.

When the first large lattices 68A have an occupation area a1 and the second large lattices 68B have an occupation area a2, the occupation areas preferably satisfy the condition of $1<a2/a1\leq 20$, more preferably satisfy the condition of $1<a2/a1\leq 10$, and particularly preferably satisfy the condition of $2\leq a2/a1\leq 10$.

The sizes of the first large lattice 68A and the second large lattice 68B are not particularly limited as long as they can satisfactorily detect the touch position of the human finger or input pen.

Though the small lattice 74 has a rhombic shape in the above example, it may have another triangle or polygonal shape. The triangle shape can be easily formed e.g. by disposing a straight thin metal wire 16 on a diagonal line of the rhombus of the small lattice 74. Each side of the small lattice 74 may have a straight line shape, a curved shape, or an arc shape. In the case of using arc-shaped sides, for example, two opposite sides may have an outwardly protruding arc shape, and the other two opposite sides may have an inwardly protruding arc shape. Alternatively, each side may have a wavy shape containing outwardly protruding arcs and inwardly protruding arcs arranged continuously. Of course, each side may have a sine curve shape.

Also the sizes of the small lattices 74 (including the side lengths and the diagonal line lengths), the number of the small lattices 74 in the first large lattice 68A, and the number of the small lattices 74 in the second large lattice 68B may be appropriately selected depending on the size and the resolution (the line number) of the touch panel 50.

As shown in FIG. 1, first alignment marks 106*a* and second alignment marks 106*b* are preferably formed on the corners etc. of the first conductive sheet 10A and the second conductive sheet 10B. The first alignment marks 106*a* and the second alignment marks 106*b* are used for positioning the first conductive sheet 10A and the second conductive sheet 10B in the process of bonding the sheets. When the first conductive sheet 10A and the second conductive sheet 10B are bonded to obtain the conductive sheet stack 54, the first alignment marks 106*a* and the second alignment marks 106*b* form composite alignment marks. The composite alignment marks may be used for positioning the conductive sheet stack 54 in the process of being attached to the display panel 58.

Though the first conductive sheet 10A and the second conductive sheet 10B are used in the projected capacitive touch panel 50 in the above example, they may be used in a surface capacitive touch panel or a resistive touch panel.

In the above conductive sheet stack 54, as shown in FIG. 3A, the first conductive part 14A is formed on the one main surface of the first transparent substrate 12A, the second conductive part 14B is formed on the one main surface of the second transparent substrate 12B, and they are stacked. Alternatively, as shown in FIG. 3B, the first conductive part 14A may be formed on the one main surface of the first transparent substrate 12A, and the second conductive part 14B may be formed on the other main surface of the first transparent substrate 12A. In this case, the second transparent substrate 12B is not used, the first transparent substrate 12A is stacked on the second conductive part 14B, and the first conductive part 14A is stacked on the first transparent substrate 12A. In addition, another layer may be disposed between the first conductive sheet 10A and the second conductive sheet 10B. The first conductive part 14A and the second conductive part 14B may be arranged facing each other as long as they are insulated.

The first conductive part 14A and the second conductive part 14B may be formed as follows. For example, a photosensitive material having the first transparent substrate 12A or the second transparent substrate 12B and thereon a photosensitive silver halide-containing emulsion layer may be exposed and developed, whereby metallic silver portions and light-transmitting portions may be formed in the exposed areas and the unexposed areas respectively to obtain the first conductive part 14A and the second conductive part 14B. The metallic silver portions may be subjected to a physical development treatment and/or a plating treatment to deposit a conductive metal thereon.

As shown in FIG. 3B, the first conductive part 14A may be formed on the one main surface of the first transparent substrate 12A, and the second conductive part 14B may be formed on the other main surface thereof. In this case, when the one main surface is exposed and then the other main surface is exposed in the usual method, the desired patterns cannot be obtained on the first conductive part 14A and the second conductive part 14B occasionally. In particular, it is difficult to uniformly form the first auxiliary patterns 66A between the first conductive patterns 64A, the second auxiliary patterns 66B between the second conductive patterns 64B, and the like as shown in FIGS. 4 and 6, etc.

Therefore, the following production method can be preferably used.

Thus, the first conductive part 14A on the one main surface and the second conductive part 14B on the other main surface can be formed by subjecting the photosensitive silver halide emulsion layers on both sides of the first transparent substrate 12A to one-shot exposure.

A specific example of the production method will be described below with reference to FIGS. 10 to 12.

Figure 10:
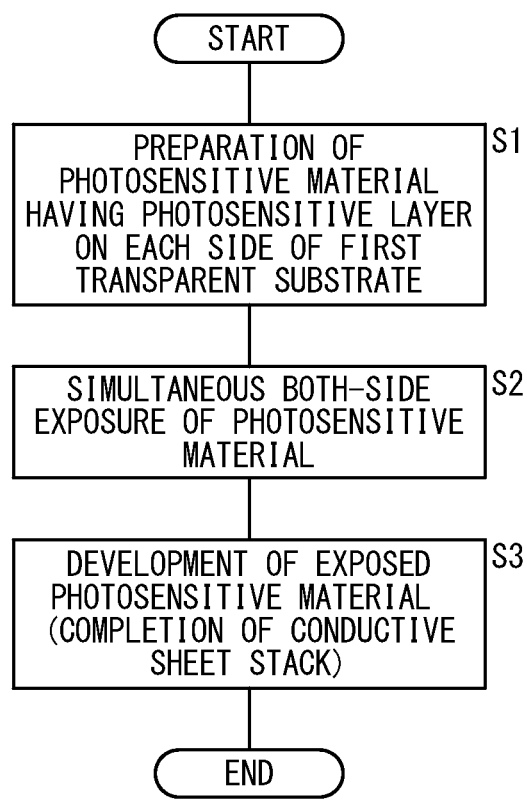
FIG. 10 is a flow chart of a both-side exposure method for producing the conductive sheet stack.
Figure 11A:
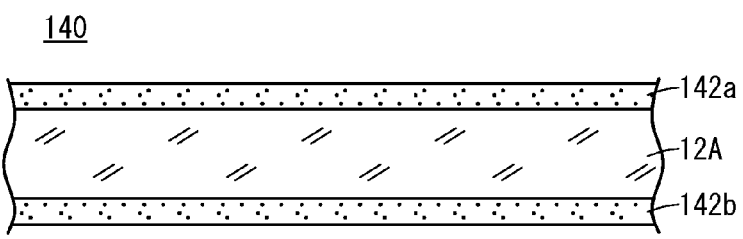
FIG. 11A is a partial cross-sectional view of a produced photosensitive material.

First, in step S1 of FIG. 10, a long photosensitive material 140 is prepared. As shown in FIG. 11A, the photosensitive material 140 has the first transparent substrate 12A, a photosensitive silver halide emulsion layer formed on one main surface of the first transparent substrate 12A (hereinafter referred to as the first photosensitive layer 142*a*), and a photosensitive silver halide emulsion layer formed on the other main surface of the first transparent substrate 12A (hereinafter referred to as the second photosensitive layer 142b).

Figure 11B:
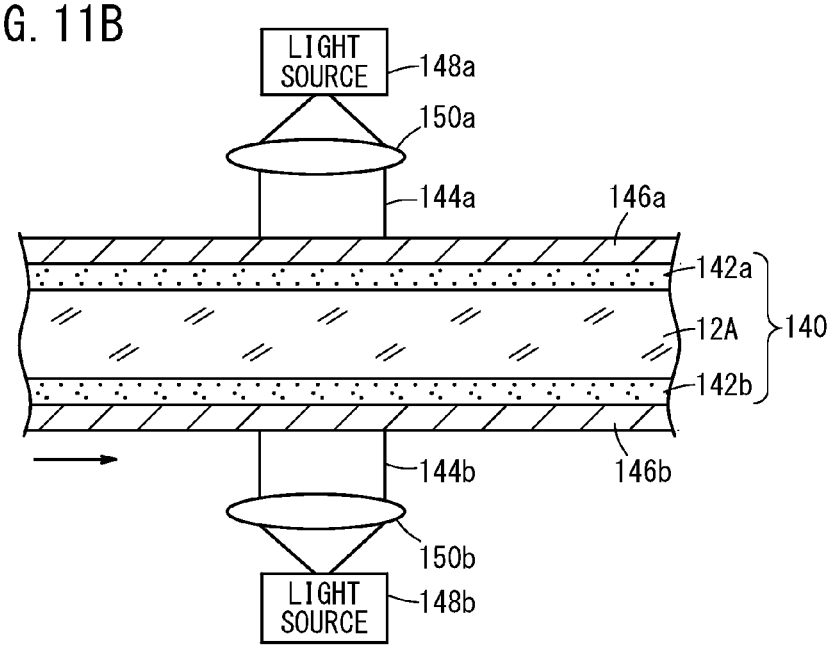
FIG. 11B is an explanatory view for illustrating simultaneous both-side exposure of the photosensitive material.

In step S2 of FIG. 10, the photosensitive material 140 is exposed. In this exposure step, a simultaneous both-side exposure, which includes a first exposure treatment for irradiating the first photosensitive layer 142a on the first transparent substrate 12A with a light in a first exposure pattern and a second exposure treatment for irradiating the second photosensitive layer 142b on the first transparent substrate 12A with a light in a second exposure pattern, is carried out. In the example of FIG. 11B, the first photosensitive layer 142a is irradiated through a first photomask 146a with a first light 144a (a parallel light), and the second photosensitive layer 142b is irradiated through a second photomask 146b with a second light 144b (a parallel light), while conveying the long photosensitive material 140 in one direction. The first light 144a is arranged such that a light from a first light source 148a is converted to the parallel light by an intermediate first collimator lens 150a, and the second light 144b is arranged such that a light from a second light source 148b is converted to the parallel light by an intermediate second collimator lens 150b. Though two light sources (the first light source 148a and the second light source 148b) are used in the example of FIG. 11B, only one light source may be used. In this case, a light from the one light source may be divided by an optical system into the first light 144a and the second light 144b for exposing the first photosensitive layer 142a and the second photosensitive layer 142b.

In step S3 of FIG. 10, the exposed photosensitive material 140 is developed to prepare e.g. the conductive sheet stack 54 shown in FIG. 3B. The conductive sheet stack 54 has the first transparent substrate 12A, the first conductive part 14A formed in the first exposure pattern on the one main surface of the first transparent substrate 12A, and the second conductive part 14B formed in the second exposure pattern on the other main surface of the first transparent substrate 12A. Preferred exposure time and development time for the first photosensitive layer 142a and the second photosensitive layer 142b depend on the types of the first light source 148a, the second light source 148b, and a developer, etc., and cannot be categorically determined. The exposure time and development time may be selected in view of achieving a development ratio of 100%.

Figure 12:
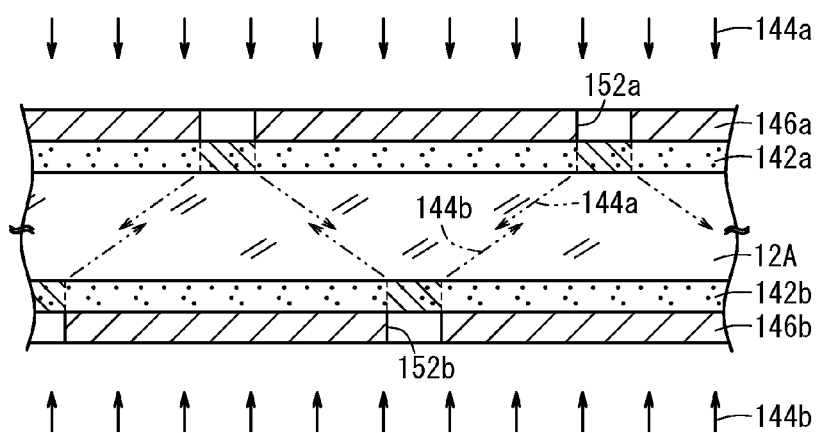
FIG. 12 is an explanatory view for illustrating first and second exposure treatments performed such that a light incident on a first photosensitive layer does not reach a second photosensitive layer and a light incident on the second photosensitive layer does not reach the first photosensitive layer.

As shown in FIG. 12, in the first exposure treatment in the production method of this embodiment, for example, the first photomask 146a is placed in close contact with the first photosensitive layer 142a, the first light source 148a is arranged facing the first photomask 146a, and the first light 144a is emitted from the first light source 148a toward the first photomask 146a, so that the first photosensitive layer 142a is exposed. The first photomask 146a has a glass substrate composed of a transparent soda glass and a mask pattern (a first exposure pattern 152a) formed thereon. Therefore, in the first exposure treatment, areas in the first photosensitive layer 142a, corresponding to the first exposure pattern 152a in the first photomask 146a, are exposed. A space of approximately 2 to 10 μm may be formed between the first photosensitive layer 142a and the first photomask 146a.

Similarly, in the second exposure treatment, for example, the second photomask 146b is placed in close contact with the second photosensitive layer 142b, the second light source 148b is arranged facing the second photomask 146b, and the second light 144b is emitted from the second light source 148b toward the second photomask 146b, so that the second photosensitive layer 142b is exposed. The second photomask 146b, as well as the first photomask 146a, has a glass substrate composed of a transparent soda glass and a mask pattern (a second exposure pattern 152b) formed thereon. Therefore, in the second exposure treatment, areas in the second photosensitive layer 142b, corresponding to the second exposure pattern 152b in the second photomask 146b, are exposed. In this case, a space of approximately 2 to 10 μm may be formed between the second photosensitive layer 142b and the second photomask 146b.

In the first and second exposure treatments, the emission of the first light 144a from the first light source 148a and the emission of the second light 144b from the second light source 148b may be carried out simultaneously or independently. When the emissions are simultaneously carried out, the first photosensitive layer 142a and the second photosensitive layer 142b can be simultaneously exposed in one exposure process to reduce the treatment time.

In a case where both of the first photosensitive layer 142a and the second photosensitive layer 142b are not spectrally sensitized, a light incident on one side may affect the image formation on the other side (the back side) in the both-side exposure of the photosensitive material 140.

Thus, the first light 144a from the first light source 148a reaches the first photosensitive layer 142a and is scattered by silver halide particles in the first photosensitive layer 142a, and a part of the scattered light is transmitted through the first transparent substrate 12A and reaches the second photosensitive layer 142b. Then, a large area of the boundary between the second photosensitive layer 142b and the first transparent substrate 12A is exposed to form a latent image. As a result, the second photosensitive layer 142b is exposed to the second light 144b from the second light source 148b and the first light 144a from the first light source 148a. When the second photosensitive layer 142b is developed to prepare the conductive sheet stack 54, the conductive pattern corresponding to the second exposure pattern 152b (the second conductive part 14B) is formed, and additionally a thin conductive layer is formed due to the first light 144a from the first light source 148a between the conductive pattern, so that the desired pattern (corresponding to the second exposure pattern 152b) cannot be obtained. This is true also for the first photosensitive layer 142a.

As a result of intense research in view of solving this problem, it has been found that when the thicknesses and the applied silver amounts of the first photosensitive layer 142a and the second photosensitive layer 142b are selected within particular ranges, the incident light can be absorbed by the silver halide to suppress the light transmission to the back side. In this embodiment, the thicknesses of the first photosensitive layer 142a and the second photosensitive layer 142b may be 1 μm or more and 4 μm or less. The upper limit is preferably 2.5 μm. The applied silver amounts of the first photosensitive layer 142a and the second photosensitive layer 142b may be 5 to 20 g/m$^2$.

In the above described contact both-side exposure technology, the exposure may be inhibited by dust or the like attached to the sheet surface to generate an image defect. It is known that the dust attachment can be prevented by applying a conductive substance such as a metal oxide or a conductive polymer to the sheet. However, the metal oxide or the like remains in the processed product, deteriorating the transparency of the final product, and the conductive polymer is disadvantageous in storage stability, etc. As a result of intense research, it has been found that a silver halide layer with reduced binder content exhibits a satisfactory conductivity for static charge prevention. Thus, the volume ratio of silver/binder is controlled in the first photosensitive layer 142a and the second photosensitive layer 142b. The silver/binder volume ratios of the first photosensitive layer 142a and the second photosensitive layer 142b are 1/1 or more, preferably 2/1 or more.

In a case where the thicknesses, the applied silver amounts, and the silver/binder volume ratios of the first photosensitive layer 142a and the second photosensitive layer 142b are selected as described above, the first light 144a emitted from the first light source 148a to the first photosensitive layer 142a does not reach the second photosensitive layer 142b as shown in FIG. 12. Similarly, the second light 144b emitted from the second light source 148b to the second photosensitive layer 142b does not reach the first photosensitive layer 142a. As a result, in the following development for producing the conductive sheet stack 54, as shown in FIG. 3B, only the conductive pattern corresponding to the first exposure pattern 152a (the pattern of the first conductive part 14A) is formed on the one main surface of the first transparent substrate 12A, and only the conductive pattern corresponding to the second exposure pattern 152b (the pattern of the second conductive part 14B) is formed on the other main surface of the first transparent substrate 12A, so that the desired patterns can be obtained.

In the production method using the above one-shot both-side exposure, the first photosensitive layer 142a and the second photosensitive layer 142b can have both of the satisfactory conductivity and both-side exposure suitability, and the same or different patterns can be formed on the surfaces of the one first transparent substrate 12A by the exposure, whereby the electrodes of the touch panel 50 can be easily formed, and the touch panel 50 can be made thinner (smaller).

In the above production method, the first conductive part 14A and the second conductive part 14B are formed using the photosensitive silver halide emulsion layers. The other production methods include the following methods.

A photosensitive layer to be plated containing a pre-plating treatment material may be formed on the first transparent substrate 12A and the second transparent substrate 12B. The resultant layer may be exposed and developed, and may be subjected to a plating treatment, whereby metal portions and light-transmitting portions may be formed in the exposed areas and the unexposed areas respectively to form the first conductive part 14A and the second conductive part 14B. The metal portions may be further subjected to a physical development treatment and/or a plating treatment to deposit a conductive metal thereon.

The following two processes can be preferably used in the method using the pre-plating treatment material. The processes are disclosed more specifically in Japanese Laid-Open Patent Publication Nos. 2003-213437, 2006-064923, 2006-058797, and 2006-135271, etc.

(a) A process comprising applying, to a transparent substrate, a plating base layer having a functional group interactable with a plating catalyst or a precursor thereof, exposing and developing the layer, and subjecting the developed layer to a plating treatment to form a metal portion on the plating base material.

(b) A process comprising applying, to a transparent substrate, an underlayer containing a polymer and a metal oxide and a plating base layer having a functional group interactable with a plating catalyst or a precursor thereof in this order, exposing and developing the layers, and subjecting the developed layers to a plating treatment to form a metal portion on the plating base material.

Alternatively, a photoresist film on a copper foil disposed on the first transparent substrate 12A or the second transparent substrate 12B may be exposed and developed to form a resist pattern, and the copper foil exposed from the resist pattern may be etched to form the first conductive part 14A or the second conductive part 14B.

A paste containing fine metal particles may be printed on the first transparent substrate 12A or the second transparent substrate 12B, and the printed paste may be plated with a metal to form the first conductive part 14A or the second conductive part 14B.

The first conductive part 14A or the second conductive part 14B may be printed on the first transparent substrate 12A or the second transparent substrate 12B by using a screen or gravure printing plate.

The first conductive part 14A or the second conductive part 14B may be formed on the first transparent substrate 12A or the second transparent substrate 12B by using an inkjet method.

A particularly preferred method, which contains using a photographic photosensitive silver halide material for producing the first conductive sheet 10A, the second conductive sheet 10B, or the conductive sheet stack 54 of this embodiment (hereinafter referred to as the conductive sheet 10), will be mainly described below. Incidentally, both of the first transparent substrate 12A and the second transparent substrate 12B are hereinafter referred to as the transparent substrate 12, and both of the first conductive part 14A and the second conductive part 14B are hereinafter referred to as the conductive part 14.

The method for producing the conductive sheet 10 of this embodiment includes the following three processes different in the photosensitive materials and development treatments.

(1) A process comprising subjecting a photosensitive black-and-white silver halide material free of physical development nuclei to a chemical or thermal development to form the metallic silver portions on the photosensitive material.

(2) A process comprising subjecting a photosensitive black-and-white silver halide material having a silver halide emulsion layer containing physical development nuclei to a solution physical development to form the metallic silver portions on the photosensitive material.

(3) A process comprising subjecting a stack of a photosensitive black-and-white silver halide material free of physical development nuclei and an image-receiving sheet having a non-photosensitive layer containing physical development nuclei to a diffusion transfer development to form the metallic silver portions on the non-photosensitive image-receiving sheet.

In the process of (1), an integral black-and-white development procedure is used to form a transmittable conductive film such as a light-transmitting conductive film on the photosensitive material. The resulting silver is a chemically or thermally developed silver in the state of a high-specific surface area filament, and thereby shows a high activity in the following plating or physical development treatment.

In the process of (2), the silver halide particles are melted around and deposited on the physical development nuclei in the exposed areas to form a transmittable conductive film such as a light-transmitting conductive film on the photosensitive material. Also in this process, an integral black-and-white development procedure is used. Though high activity can be achieved since the silver halide is deposited on the physical development nuclei in the development, the developed silver has a spherical shape with small specific surface.

In the process of (3), the silver halide particles are melted in the unexposed areas, and are diffused and deposited on the development nuclei of the image-receiving sheet, to form a transmittable conductive film such as a light-transmitting conductive film on the sheet. In this process, a so-called separate-type procedure is used, the image-receiving sheet being peeled off from the photosensitive material.

A negative or reversal development treatment can be used in the processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd., 1955 and C. E. K. Mees, "*The Theory of Photographic Processes, 4th ed.*", Mcmillan, 1977. A liquid treatment is generally used in the present invention, and also a thermal development treatment can be utilized. For example, techniques described in Japanese Laid-Open Patent Publication Nos. 2004-184693, 2004-334077, and 2005-010752 and Japanese Patent Application Nos. 2004-244080 and 2004-085655 can be used in the present invention.

The structure of each layer in the conductive sheet 10 of this embodiment will be described in detail below.

[Transparent Substrate 12]

The transparent substrate 12 may be a plastic sheet, a plastic plate, a glass plate, etc.

Examples of materials for the plastic sheet and the plastic plate include polyesters such as polyethylene terephthalates (PET) and polyethylene naphthalates (PEN), and triacetyl celluloses (TAC).

The transparent substrate 12 is preferably a sheet or plate of a plastic having a melting point of about 290° C. or lower. The PET is particularly preferred from the viewpoints of light transmittance, workability, etc.

[Silver Salt Emulsion Layer]

The silver salt emulsion layer for forming the thin metal wires 16 of the conductive sheet 10 contains a silver salt and a binder and may further contain a solvent and an additive such as a dye.

The silver salt used in this embodiment may be an inorganic silver salt such as a silver halide or an organic silver salt such as silver acetate. In this embodiment, the silver halide is preferred because of its excellent light sensing property.

The applied silver amount (the amount of the applied silver salt in the silver density) of the silver salt emulsion layer is preferably 1 to 30 g/m$^2$, more preferably 1 to 25 g/m$^2$, further preferably 5 to 20 g/m$^2$. When the applied silver amount is within this range, the resultant conductive sheet 10 can exhibit a desired surface resistance.

Examples of the binders used in this embodiment include gelatins, polyvinyl alcohols (PVA), polyvinyl pyrolidones (PVP), polysaccharides such as starches, celluloses and derivatives thereof, polyethylene oxides, polyvinylamines, chitosans, polylysines, polyacrylic acids, polyalginic acids, polyhyaluronic acids, and carboxycelluloses. The binders show a neutral, anionic, or cationic property depending on the ionicity of a functional group.

In this embodiment, the amount of the binder in the silver salt emulsion layer is not particularly limited, and may be appropriately selected to obtain sufficient dispersion and adhesion properties. The volume ratio of silver/binder in the silver salt emulsion layer is preferably 1/4 or more, more preferably 1/2 or more. The silver/binder volume ratio is preferably 100/1 or less, more preferably 50/1 or less. Particularly, the silver/binder volume ratio is further preferably 1/1 to 4/1, most preferably 1/1 to 3/1. As long as the silver/binder volume ratio of the silver salt emulsion layer falls within this range, the resistance variation can be reduced even under various applied silver amount, whereby the conductive sheet 10 can be produced with a uniform surface resistance. The silver/binder volume ratio can be obtained by converting the silver halide/binder weight ratio of the material to the silver/binder weight ratio, and by further converting the silver/binder weight ratio to the silver/binder volume ratio.

<Solvent>

The solvent used for forming the silver salt emulsion layer is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

<Other Additives>

The additives used in this embodiment are not particularly limited, and may be preferably selected from known additives.

[Other Layers]

A protective layer (not shown) may be formed on the silver salt emulsion layer. In addition, an undercoat layer or the like may be formed below the silver salt emulsion layer.

The steps for producing the conductive sheet 10 will be described below.

[Exposure]

In this embodiment, the conductive part 14 may be formed in a printing process, and may be formed by exposure and development treatments, etc. in another process. Thus, a photosensitive material having the transparent substrate 12 and thereon the silver salt-containing layer or a photosensitive material coated with a photopolymer for photolithography is subjected to the exposure treatment. An electromagnetic wave may be used in the exposure. For example, the electromagnetic wave may be a light such as a visible light or an ultraviolet light, or a radiation ray such as an X-ray. The exposure may be carried out using a light source having a wavelength distribution or a specific wavelength.

[Development Treatment]

In this embodiment, the emulsion layer is subjected to the development treatment after the exposure. Common development treatment technologies for photographic silver salt sheets, photographic papers, print engraving sheets, emulsion masks for photomasking, and the like may be used in the present invention.

In the present invention, the development process may include a fixation treatment for removing the silver salt in the unexposed areas to stabilize the material. Fixation treatment technologies for photographic silver salt sheets, photographic papers, print engraving sheets, emulsion masks for photomasking, and the like may be used in the present invention.

The developed and fixed photosensitive material is preferably subjected to a water washing treatment or a stabilization treatment.

The ratio of the metallic silver contained in the exposed areas after the development to the silver contained in the areas before the exposure is preferably 50% or more, more preferably 80% or more by mass. When the ratio is 50% or more by mass, a high conductivity can be achieved.

The conductive sheet 10 is obtained by the above steps. The surface resistance of the resultant conductive sheet 10 is preferably within a range of 0.1 to 100 ohm/sq. The lower limit is preferably 1 ohm/sq or more, 3 ohm/sq or more, 5 ohm/sq or more, or 10 ohm/sq or more. The upper limit is preferably 90 ohm/sq or less, 70 ohm/sq or less, or 50 ohm/sq or less. When the surface resistance is controlled within this range, the position detection can be performed even in a large touch panel having an area of 10 cm×10 cm or more. The conductive sheet 10 may be subjected to a calender treatment after the development treatment to obtain a desired surface resistance.

[Physical Development Treatment and Plating Treatment]

In this embodiment, to increase the conductivity of the metallic silver portion formed by the above exposure and development treatments, conductive metal particles may be deposited thereon by a physical development treatment and/or a plating treatment. In the present invention, the conductive metal particles may be deposited on the metallic silver portion by only one of the physical development and plating treatments or by the combination of the treatments. The metallic silver portion, subjected to the physical development treatment and/or the plating treatment in this manner, is also referred to as the conductive metal portion.

In this embodiment, the physical development is such a process that metal ions such as silver ions are reduced by a reducing agent, whereby metal particles are deposited on a metal or metal compound core. Such physical development has been used in the fields of instant B & W sheet, instant slide sheet, printing plate production, etc., and the technologies can be used in the present invention. The physical development may be carried out at the same time as the above development treatment after the exposure, and may be carried out after the development treatment separately.

In this embodiment, the plating treatment may contain electroless plating (such as chemical reduction plating or displacement plating), electrolytic plating, or a combination thereof. Known electroless plating technologies for printed circuit boards, etc. may be used in this embodiment. The electroless plating is preferably electroless copper plating.

[Oxidation Treatment]

In this embodiment, the metallic silver portion formed by the development treatment or the conductive metal portion formed by the physical development treatment and/or the plating treatment is preferably subjected to an oxidation treatment. For example, by the oxidation treatment, a small amount of a metal deposited on the light-transmitting portion can be removed, so that the transmittance of the light-transmitting portion can be increased to approximately 100%.

[Conductive Metal Portion]

In this embodiment, the lower limit of the line width of the conductive metal portion (the thin metal wire 16) may be 0.1 μm or more as described above. The lower limit of the line width is preferably 1 μm or more, 3 μm or more, 4 μm or more, or 5 μm or more, and the upper limit thereof is preferably 15 μm or less, 10 μm or less, 9 μm or less, or 8 μm or less. When the line width is less than the lower limit, the conductive metal portion has an insufficient conductivity, whereby the touch panel 50 using the portion has an insufficient detection sensitivity. On the other hand, when the line width is more than the upper limit, moire is significantly generated due to the conductive metal portion, and the touch panel 50 using the portion has a poor visibility. When the line width is within the above range, the moire of the conductive metal portion is improved, and the visibility is remarkably improved. The side length of the small lattice 74 is preferably 30 to 500 μm, more preferably 50 to 400 μm, most preferably 100 to 350 μm. The conductive metal portion may have a part with a line width of more than 200 μm for the purpose of ground connection, etc.

In this embodiment, the opening ratio of the conductive metal portion is preferably 85% or more, more preferably 90% or more, most preferably 95% or more, in view of the visible light transmittance. The opening ratio is the ratio of the light-transmitting portions other than the thin metal wires 16 to the entire conductive part. For example, a rhombic lattice having a line width of 6 μm and a side length of 240 μm has an opening ratio of 95%.

[Light-Transmitting Portion]

In this embodiment, the light-transmitting portion is a portion having light transmittance, other than the conductive metal portions in the conductive sheet 10. The transmittance of the light-transmitting portion, which is herein a minimum transmittance value in a wavelength region of 380 to 780 nm obtained neglecting the light absorption and reflection of the transparent substrate 12, is 90% or more, preferably 95% or more, more preferably 97% or more, further preferably 98% or more, most preferably 99% or more.

The exposure is preferably carried out using a glass mask method or a laser lithography pattern exposure method.

[Conductive Sheet 10]

In the conductive sheet 10 of this embodiment, the thickness of the transparent substrate 12 is preferably 50 to 350 μm, more preferably 75 to 250 μm, particularly preferably 100 to 200 μm. When the thickness is within the range of 50 to 350 μm, a desired visible light transmittance can be obtained, and the transparent substrate 12 can be easily handled.

The thickness of the metallic silver portion formed on the transparent substrate 12 may be appropriately selected by controlling the thickness of the coating liquid for the silver salt-containing layer applied to the transparent substrate 12. The thickness of the metallic silver portion may be selected within a range of 0.001 to 0.2 mm, and is preferably 30 μm or less, more preferably 20 μm or less, further preferably 0.01 to 9 μm, most preferably 0.05 to 5 μm. The metallic silver portion is preferably formed in a patterned shape. The metallic silver portion may have a monolayer structure or a multilayer structure containing two or more layers. When the metallic silver portion has a patterned multilayer structure containing two or more layers, the layers may have different wavelength color sensitivities. In this case, different patterns can be formed in the layers by using exposure lights with different wavelengths.

In the case of using the conductive sheet 10 in the touch panel 50, the thin metal wire 16 preferably has a smaller thickness. As the thickness is reduced, the viewing angle and visibility of the display panel 58 are improved. Thus, the thickness of the thin metal wire 16 is preferably less than 9 μm, more preferably 0.1 μm or more but less than 5 μm, further preferably 0.1 μm or more but less than 3 μm.

In this embodiment, the thickness of the metallic silver portion can be controlled by changing the coating thickness of the silver salt-containing layer, and the thickness of the thin metal wire 16 can be controlled in the physical development treatment and/or the plating treatment, whereby the conductive sheet having a thickness of less than 5 μm (preferably less than 3 μm) can be easily produced.

The plating or the like is not necessarily carried out in the method for producing the conductive sheet 10 of this embodiment. This is because the desired surface resistance can be obtained by controlling the applied silver amount and the silver/binder volume ratio of the silver salt emulsion layer in the method. The calender treatment or the like may be carried out if necessary.

(Film Hardening Treatment after Development Treatment)

It is preferred that after the silver salt emulsion layer is developed, the resultant is immersed in a hardener and thus subjected to a film hardening treatment. Examples of the hardeners include dialdehydes (such as glutaraldehyde, adipaldehyde, and 2,3-dihydroxy-1,4-dioxane) and boric acid, described in Japanese Laid-Open Patent Publication No. 02-141279.

An additional functional layer such as an antireflection layer or a hard coat layer may be formed in the conductive sheet 10 of this embodiment.

[Calender Treatment]

The developed metallic silver portion may be smoothened by a calender treatment. The conductivity of the metallic silver portion can be significantly increased by the calender treatment. The calender treatment may be carried out using a calender roll unit. The calender roll unit generally has a pair of rolls.

The roll used in the calender treatment may be composed of a metal or a plastic (such as an epoxy, polyimide, polyamide, or polyimide-amide). Particularly in a case where the photosensitive material has the emulsion layer on both sides, it is preferably treated with a pair of the metal rolls. In a case where the photosensitive material has the emulsion layer only on one side, it may be treated with the combination of the metal roll and the plastic roll in view of wrinkling prevention. The upper limit of the line pressure is preferably 1960 N/cm (200 kgf/cm, corresponding to a surface pressure of 699.4 kgf/cm$^2$) or more, more preferably 2940 N/cm (300 kgf/cm, corresponding to a surface pressure of 935.8 kgf/cm$^2$) or more. The upper limit of the line pressure is 6880 N/cm (700 kgf/cm) or less.

The smoothing treatment such as the calender treatment is preferably carried out at a temperature of 10° C. (without temperature control) to 100° C. Though the preferred treatment temperature range depends on the density and shape of the metal mesh or metal wiring pattern, the type of the binder, etc., the temperature is more preferably 10° C. (without temperature control) to 50° C. in general.

The present invention may be appropriately combined with technologies described in the following patent publications and international patent pamphlets shown in Tables 1 and 2. "Japanese Laid-Open Patent", "Publication No.", "Pamphlet No.", etc. are omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

The present invention will be described more specifically below with reference to Examples. Materials, amounts, ratios, treatment contents, treatment procedures, and the like, used in Examples, may be appropriately changed without departing from the scope of the present invention. The following specific examples are therefore to be considered in all respects as illustrative and not restrictive.

First Example

In First Example, in each of the conductive sheets 10 of Examples 1 to 9, the side length of the small lattice 74, the line width of the thin metal wire 16, and the surface resistance of the representative first conductive pattern 64A were measured, and the moire and visibility were evaluated. The properties and evaluation results of Examples 1 to 9 are shown in Table 3.

Examples 1 to 9

(Photosensitive Silver Halide Material)

An emulsion containing an aqueous medium, a gelatin, and silver iodobromochloride particles was prepared. The amount of the gelatin was 10.0 g per 150 g of Ag, and the silver iodobromochloride particles had an I content of 0.2 mol %, a Br content of 40 mol %, and an average spherical equivalent diameter of 0.1 µm.

$K_3Rh_2Br_9$ and $K_2IrCl_6$ were added to the emulsion at a concentration of $10^{-7}$ (mol/mol-silver) to dope the silver bromide particles with Rh and Ir ions. $Na_2PdCl_4$ was further added to the emulsion, and the resultant emulsion was subjected to gold-sulfur sensitization using chlorauric acid and sodium thiosulfate. The emulsion and a gelatin hardening agent were applied to the first transparent substrate 12A or the second transparent substrate 12B having a thickness of 150 µm, both composed of a polyethylene terephthalate (PET). The amount of the applied silver was 10 g/m$^2$, and the Ag/gelatin volume ratio was 2/1.

The PET support had a width of 30 cm, and the emulsion was applied thereto into a width of 25 cm and a length of 20 m. The both end portions having a width of 3 cm were cut off to obtain a roll photosensitive silver halide material having a width of 24 cm.

(Exposure)

Figure 5:
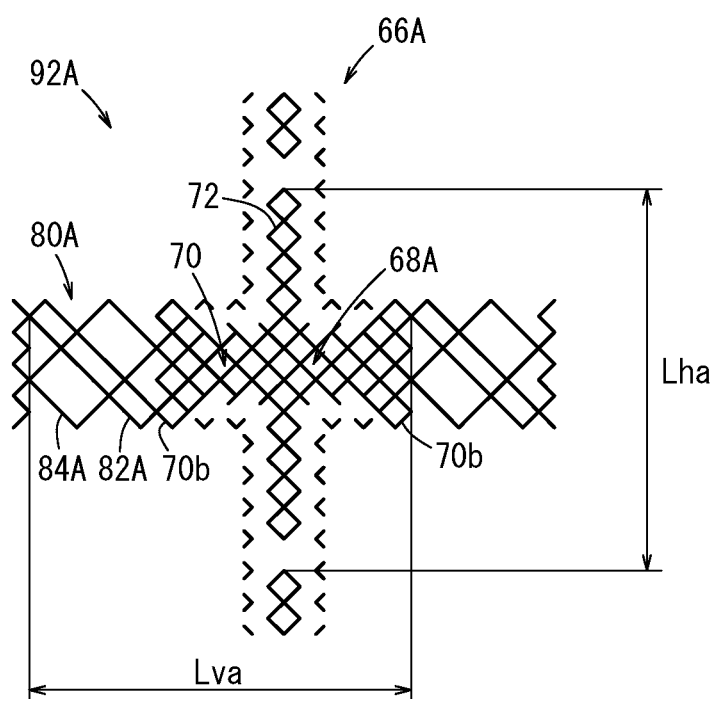
FIG. 5 is an explanatory view for illustrating sizes (aspect ratios) of a first large lattice (a first sensing portion) and a first unit pattern.
Figure 7:
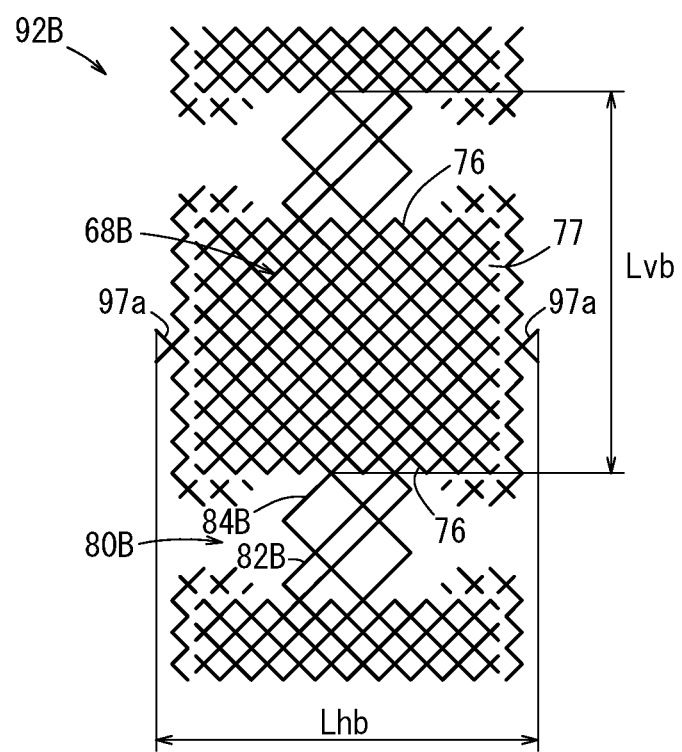
FIG. 7 is an explanatory view for illustrating sizes (aspect ratios) of a second large lattice (a second sensing portion) and a second unit pattern.

An A4 (210 mm×297 mm) sized area of the first transparent substrate 12A was exposed in the pattern of the first conductive sheet 10A shown in FIGS. 4 and 5, and an A4 sized area of the second transparent substrate 12B was exposed in the pattern of the second conductive sheet 10B shown in FIGS. 6 and 7. The exposure was carried out using a parallel light from a light source of a high-pressure mercury lamp and patterned photomasks.

(Development Treatment)

Formulation of 1 L of Developer

| | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | Controlled at 10.3 |

Formulation of 1 L of Fixer

| | |
|---|---|
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| pH | Controlled at 6.2 |

The exposed photosensitive material was treated with the above treatment agents using an automatic processor FG-710PTS manufactured by FUJIFILM Corporation under the following conditions. A development treatment was carried out at 35° C. for 30 seconds, a fixation treatment was carried out at 34° C. for 23 seconds, and then a water washing treatment was carried out for 20 seconds at a water flow rate of 5 L/min.

Example 1

In the conductive parts (including the first conductive patterns 64A and the second conductive patterns 64B) of the prepared first conductive sheet 10A and second conductive sheet 10B, the side length of the small lattice 74 was 30 μm and the line width of the thin metal wire 16 was 1 μm.

Example 2

The first conductive sheet 10A and the second conductive sheet 10B of Example 2 were produced in the same manner as Example 1 except that the side length of the small lattice 74 was 40 μm and the line width of the thin metal wire 16 was 3 μm.

Example 3

The first conductive sheet 10A and the second conductive sheet 10B of Example 3 were produced in the same manner as Example 1 except that the side length of the small lattice 74 was 50 μm and the line width of the thin metal wire 16 was 4 μm.

Example 4

The first conductive sheet 10A and the second conductive sheet 10B of Example 4 were produced in the same manner as Example 1 except that the side length of the small lattice 74 was 80 μm and the line width of the thin metal wire 16 was 5 μm.

Example 5

The first conductive sheet 10A and the second conductive sheet 10B of Example 5 were produced in the same manner as Example 1 except that the side length of the small lattice 74 was 100 μm and the line width of the thin metal wire 16 was 8 μm.

Example 6

The first conductive sheet 10A and the second conductive sheet 10B of Example 6 were produced in the same manner as Example 1 except that the side length of the small lattice 74 was 250 μm and the line width of the thin metal wire 16 was 9 μm.

Example 7

The first conductive sheet 10A and the second conductive sheet 10B of Example 7 were produced in the same manner as Example 1 except that the side length of the small lattice 74 was 350 μm and the line width of the thin metal wire 16 was 10 μm.

Example 8

The first conductive sheet 10A and the second conductive sheet 10B of Example 8 were produced in the same manner as Example 1 except that the side length of the small lattice 74 was 400 μm and the line width of the thin metal wire 16 was 15 μm.

Example 9

The first conductive sheet 10A and the second conductive sheet 10B of Example 9 were produced in the same manner as Example 1 except that the side length of the small lattice 74 was 500 μm and the line width of the thin metal wire 16 was 15 μm.

(Surface Resistance Measurement)

In each of the first conductive sheets 10A and the second conductive sheets 10B, the surface resistivity values of randomly selected 10 points were measured by LORESTA GP (Model No. MCP-T610) manufactured by Dia Instruments Co., Ltd. utilizing an in-line four-probe method (ASP), and the average of the measured values was obtained to evaluate the detection accuracy.

(Transmittance Measurement)

The transmittance value of the light-transmitting portion in the first conductive sheet 10A and the second conductive sheet 10B was measured by a spectrophotometer to evaluate the transparency of the first transparent substrate 12A.

(Moire Evaluation)

In Examples 1 to 9, the first conductive sheet 10A was stacked on the second conductive sheet 10B to prepare the conductive sheet stack 54, and the conductive sheet stack 54 was attached to the display screen of the display device 30 (liquid crystal display) to produce the touch panel 50. The touch panel 50 was fixed to a turntable, and the display device 30 was operated to display a white color. The moire of the conductive sheet stack 54 was visually observed and evaluated while turning the turntable within a bias angle range of −45° to +45°.

The moire was observed at a distance of 1.5 m from the display screen 58a of the display device 30. The conductive sheet stack 54 was evaluated as "Good" when the moire was not visible, as "Fair" when the moire was slightly visible to an acceptable extent, or as "Poor" when the moire was highly visible.

(Visibility Evaluation)

Before the moire evaluation, the touch panel 50 was fixed to the turntable, the display device 30 was operated to display the white color, and whether a thickened line or a black point was formed or not in the touch panel 50 and whether boundaries between the first conductive patterns 64A and the second conductive patterns 64B were visible or not in the touch panel 50 were evaluated by the naked eye.

TABLE 3

|  | Side length of small lattice (μm) | Line width of thin metal wire (μm) | Thickness of transparent substrate (μm) | Surface resistance (Ω/sq) | Moire evaluation | Visibility evaluation |
| --- | --- | --- | --- | --- | --- | --- |
| Example 1 | 30 | 1 | 150 | 90 | Good | Good |
| Example 2 | 40 | 3 | 150 | 85 | Good | Good |

TABLE 3-continued

|  | Side length of small lattice (μm) | Line width of thin metal wire (μm) | Thickness of transparent substrate (μm) | Surface resistance (Ω/sq) | Moire evaluation | Visibility evaluation |
|---|---|---|---|---|---|---|
| Example 3 | 50 | 4 | 150 | 80 | Good | Good |
| Example 4 | 80 | 5 | 150 | 75 | Good | Good |
| Example 5 | 100 | 8 | 150 | 65 | Good | Good |
| Example 6 | 250 | 9 | 150 | 50 | Good | Good |
| Example 7 | 350 | 10 | 150 | 45 | Good | Good |
| Example 8 | 400 | 15 | 150 | 40 | Good | Good |
| Example 9 | 500 | 15 | 150 | 40 | Fair | Fair |

Among Examples 1 to 9, the conductive sheet stacks 54 of Examples 1 to 8 had excellent conductivity, transmittance, moire, and visibility properties. The conductive sheet stack 54 of Example 9 was inferior to those of Examples 1 to 8 in the moire and visibility properties. However, in Example 9, the moire was only slightly visible to an acceptable extent, and an image on the display device 30 could be observed without any difficulty.

Therefore, it is clear that the side length of the small lattice 74 is preferably 30 to 500 μm, more preferably 50 to 400 μm, particularly preferably 100 to 350 μm. Furthermore, it is clear that the lower limit of the line width of the thin metal wire 16 is preferably 1 μm or more, 3 μm or more, 4 μm or more, or 5 μm or more, and the upper limit is preferably 15 μm or less, 10 μm or less, 9 μm or less, or 8 μm or less.

Second Example

In Second Example, in the first conductive sheets 10A of Examples 11 to 17 and Reference Examples 11 and 12, the thickness of the first transparent substrate 12A was changed to evaluate the detection sensitivity and the visibility. The properties and evaluation results of Examples 11 to 17 and Reference Example 11 and 12 are shown in Table 4.

Example 11

The first conductive sheet 10A and the second conductive sheet 10B of Example 11 were produced in the same manner as Example 1 except that, in the conductive parts 14 (including the first conductive patterns 64A and the second conductive patterns 64B), the side length of the small lattice 74 was 80 μm, the line width of the thin metal wire 16 was 5 μm, and the thickness of the first transparent substrate 12A was 50 μm.

Example 12

The first conductive sheet 10A and the second conductive sheet 10B of Example 12 were produced in the same manner as Example 11 except that the thickness of the first transparent substrate 12A was 80 μm.

Example 13

The first conductive sheet 10A and the second conductive sheet 10B of Example 13 were produced in the same manner as Example 11 except that the thickness of the first transparent substrate 12A was 100 μm.

Example 14

The first conductive sheet 10A and the second conductive sheet 10B of Example 14 were produced in the same manner as Example 11 except that the thickness of the first transparent substrate 12A was 150 μm.

Example 15

The first conductive sheet 10A and the second conductive sheet 10B of Example 15 were produced in the same manner as Example 11 except that the thickness of the first transparent substrate 12A was 200 μm.

Example 16

The first conductive sheet 10A and the second conductive sheet 10B of Example 16 were produced in the same manner as Example 11 except that the thickness of the first transparent substrate 12A was 250 μm.

Example 17

The first conductive sheet 10A and the second conductive sheet 10B of Example 17 were produced in the same manner as Example 11 except that the thickness of the first transparent substrate 12A was 350 μm.

Reference Example 11

The first conductive sheet 10A and the second conductive sheet 10B of Reference Example 11 were produced in the same manner as Example 11 except that the thickness of the first transparent substrate 12A was 30 μm.

Reference Example 12

The first conductive sheet 10A and the second conductive sheet 10B of Reference Example 12 were produced in the same manner as Example 11 except that the thickness of the first transparent substrate 12A was 400 μm.

(Detection Sensitivity Evaluation)

A finger was moved in a predetermined direction on each touch panel 50 to obtain a detection waveform. The detection sensitivity was evaluated based on the detection waveform. The touch panel 50 was evaluated as "Excellent" when the detection sensitivity was more than 110% of a predetermined threshold value, as "Good" when it was 90% to 110% of the threshold value, or as "Fair" when it was less than 90% of the threshold value.

The results of Examples 11 to 17 and Reference Examples 11 and 12 are shown in Table 4.

TABLE 4

|  | Side length of small lattice (μm) | Line width of thin metal wire (μm) | Thickness of transparent substrate (μm) | Transmittance of light-transmitting portion (%) | Detection sensitivity | Visibility evaluation |
| --- | --- | --- | --- | --- | --- | --- |
| Reference Example 11 | 80 | 5 | 30 | 99 | Fair | Good |
| Example 11 | 80 | 5 | 50 | 99 | Good | Good |
| Example 12 | 80 | 5 | 80 | 99 | Good | Good |
| Example 13 | 80 | 5 | 100 | 97 | Excellent | Good |
| Example 14 | 80 | 5 | 150 | 97 | Excellent | Good |
| Example 15 | 80 | 5 | 200 | 95 | Excellent | Good |
| Example 16 | 80 | 5 | 250 | 95 | Good | Good |
| Example 17 | 80 | 5 | 350 | 90 | Good | Good |
| Reference Example 12 | 80 | 5 | 400 | 80 | Poor | Poor |

As shown in Table 4, though the conductive sheet stack 54 of Reference Example 11 had a good visibility, it had a low detection sensitivity. It was likely that because the first transparent substrate 12A had a small thickness of 30 μm, a large parasitic capacitance was formed between the first conductive patterns 64A and the second conductive patterns 64B, and the detection sensitivity was deteriorated due to the parasitic capacitance. The conductive sheet stack 54 of Reference Example 12 was poor in both of the detection sensitivity and the visibility. It was likely that because the first transparent substrate 12A had a remarkably large thickness of 400 μm, the finger touch position was hardly detected by the second conductive patterns 64B in the self capacitance technology, and signals from the second conductive patterns 64B (the drive electrodes) were hardly received by the first conductive patterns 64A (the receiving electrodes) in the mutual capacitance technology. The visibility was deteriorated because the first transparent substrate 12A had a remarkably large thickness of 400 μm, whereby the light-transmitting portions had a low transmittance of 80% to lower the transparency.

In contrast, the conductive sheet stacks 54 of Examples 11 to 17 had high detection sensitivities and high visibilities. Particularly the conductive sheet stacks 54 of Examples 13 to 15 had excellent detection sensitivities.

Therefore, it is clear that the thickness of the transparent substrate (the first transparent substrate 12A) disposed between the first conductive part 14A and the second conductive part 14B is preferably 50 to 350 μm, further preferably 80 to 250 μm, particularly preferably 100 to 200 μm.

It is to be understood that the conductive sheet and the touch panel of the present invention are not limited to the above embodiments, and various changes and modifications may be made therein without departing from the scope of the present invention.

The invention claimed is:

1. A conductive sheet comprising a first conductive part and a second conductive part, stacked with a substrate interposed therebetween, wherein
the first conductive part contains two or more first conductive patterns arranged in one direction, the first conductive patterns being composed of thin metal wires,
the second conductive part contains two or more second conductive patterns arranged in another direction approximately perpendicular to the one direction, the second conductive patterns being composed of thin metal wires,
the first conductive patterns each contain two or more first sensing portions connected with each other, the first sensing portions being composed of thin metal wires,
the second conductive patterns each contain two or more second sensing portions connected with each other, the second sensing portions being composed of thin metal wires,
the first sensing portions and the second sensing portions each contain a plurality of small lattices arranged,
the first sensing portions each contain a strip composed of thin metal wires and protrusions composed of thin metal wires, wherein the strip and the protrusions are electrically connected,
the strip extends in the other direction approximately perpendicular to the one direction, and the protrusions extend from both sides of the strip in the one direction,
the strip and the protrusions both contain the plurality of small lattices arranged,
the second sensing portions each cover most of a region surrounded by the strip and the protrusions,
an occupation area of the second sensing portion is larger than an occupation area of the first sensing portion, and
as viewed from above, overlaps of the first conductive patterns and the second conductive patterns each contain a combination of a plurality of the small lattices.

2. The conductive sheet according to claim 1, wherein a width of the strip is smaller than a length of the strip.

3. The conductive sheet according to claim 1, wherein a length of the protrusion is at least ½ of a width of the strip.

4. The conductive sheet according to claim 1, wherein a width of the protrusion is at most ½ of a length of the protrusion.

5. The conductive sheet according to claim 1, wherein a length of the second sensing portion in the other direction perpendicular to the one direction is 0.5 to 2 times as large as a length of the second sensing portion in the one direction.

6. The conductive sheet according to claim 1, wherein the protrusions in two adjacent first sensing portions are arranged facing each other.

7. The conductive sheet according to claim 1, wherein
the small lattices have a side length of 30 to 500 μm, and
the thin metal wires have a line width of 15 μm or less.

8. The conductive sheet according to claim 1, wherein the substrate has a thickness of 50 to 350 μm.

9. A touch panel comprising a conductive sheet, which is used on a display panel, wherein
the conductive sheet contains a first conductive part and a second conductive part, stacked with a substrate interposed therebetween,
the first conductive part contains two or more first conductive patterns arranged in one direction, the first conductive patterns being composed of thin metal wires, the second conductive part contains two or more second conductive patterns arranged in another direction approximately perpendicular to the one direction, the second conductive patterns being composed of thin metal wires, the first conductive patterns each contain two or more first sensing portions connected with each other, the first sensing portions being composed of thin metal wires, the second conductive patterns each contain two or more second sensing portions connected with each other, the second sensing portions being composed of thin metal wires, the first sensing portions and the second sensing portions each contain a plurality of small lattices arranged, the first sensing portions each contain a strip composed of thin metal wires and protrusions composed of thin metal wires, wherein the strip and the protrusions are electrically connected, the strip extends in the other direction approximately perpendicular to the one direction, and the protrusions extend from both sides of the strip in the one direction, the strip and the protrusions both contain the plurality of small lattices arranged, the second sensing portions each cover most of a region surrounded by the strip and the protrusions, an occupation area of the second sensing portion is larger than an occupation area of the first sensing portion, and as viewed from above, overlaps of the first conductive patterns and the second conductive patterns each contain a combination of a plurality of the small lattices.

10. The touch panel according to claim 9, wherein a width of the strip is smaller than a length of the strip.

11. The touch panel according to claim 9, wherein a length of the protrusion is at least ½ of a width of the strip.

12. The touch panel according to claim 9, wherein a width of the protrusion is at most ½ of a length of the protrusion.

13. The touch panel according to claim 9, wherein a length of the second sensing portion in the other direction perpendicular to the one direction is 0.5 to 2 times as large as a length of the second sensing portion in the one direction.

14. The touch panel according to claim 9, wherein the protrusions in the adjacent first sensing portions are arranged facing each other.

15. The touch panel according to claim 9, wherein
the small lattices have a side length of 30 to 500 μm, and
the thin metal wires have a line width of 15 μm or less.

16. The touch panel according to claim 9, wherein the substrate has a thickness of 50 to 350 μm.

* * * * *